(12) United States Patent
Lim

(10) Patent No.: US 10,727,439 B2
(45) Date of Patent: Jul. 28, 2020

(54) DISPLAY PANEL FOR MAINTAINING PARALLEL SUBSTRATES WITH CONSTANT SPACE AND DISPLAY DEVICE INCLUDING THE SAME

(71) Applicant: LG DISPLAY CO., LTD., Seoul (KR)

(72) Inventor: Jiwon Lim, Gyeonggi-do (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/210,208

(22) Filed: Dec. 5, 2018

(65) Prior Publication Data

US 2019/0173042 A1    Jun. 6, 2019

(30) Foreign Application Priority Data

Dec. 5, 2017 (KR) .................. 10-2017-0165954

(51) Int. Cl.
| | | |
|---|---|---|
| *H01L 51/50* | (2006.01) | |
| *H01L 51/52* | (2006.01) | |
| *H01L 27/32* | (2006.01) | |
| *H01L 51/00* | (2006.01) | |
| *G09G 3/3233* | (2016.01) | |
| *G02F 1/13* | (2006.01) | |

(52) U.S. Cl.
CPC .............. *H01L 51/525* (2013.01); *G02F 1/13* (2013.01); *G09G 3/3233* (2013.01); *H01L 27/3216* (2013.01); *H01L 27/3218* (2013.01); *H01L 27/3246* (2013.01); *H01L 27/3276* (2013.01); *H01L 51/0097* (2013.01)

(58) Field of Classification Search
CPC ............... H01L 51/525; H01L 27/3216; H01L 27/3218; H01L 27/3246; H01L 51/0097; H01L 27/3276; G02F 1/13; G09G 3/3233
See application file for complete search history.

(56) References Cited

U.S. PATENT DOCUMENTS

| | | | |
|---|---|---|---|
| 2010/0207107 A1* | 8/2010 | Kim | ...................... H01L 51/525 |
| | | | 257/40 |
| 2014/0103368 A1* | 4/2014 | Hatano | ............... H01L 27/3246 |
| | | | 257/88 |
| 2014/0117336 A1* | 5/2014 | Kim | .................... H01L 51/5246 |
| | | | 257/40 |

* cited by examiner

Primary Examiner — Selim U Ahmed
(74) Attorney, Agent, or Firm — Polsinelli PC

(57) ABSTRACT

The present disclosure relates to the display panel and the display device include a first electrode disposed on a substrate, at least one spacer disposed on the bank, the outer edge of the spacer includes a first outer edge portion corresponding to from the bank to a first height above the bank and a second outer edge portion corresponding to a predetermined height from the first height. The first outer edge portion has a second tapering shape, and the second outer edge portion includes a part having a first tapering shape or a part having a convex shape.

22 Claims, 21 Drawing Sheets

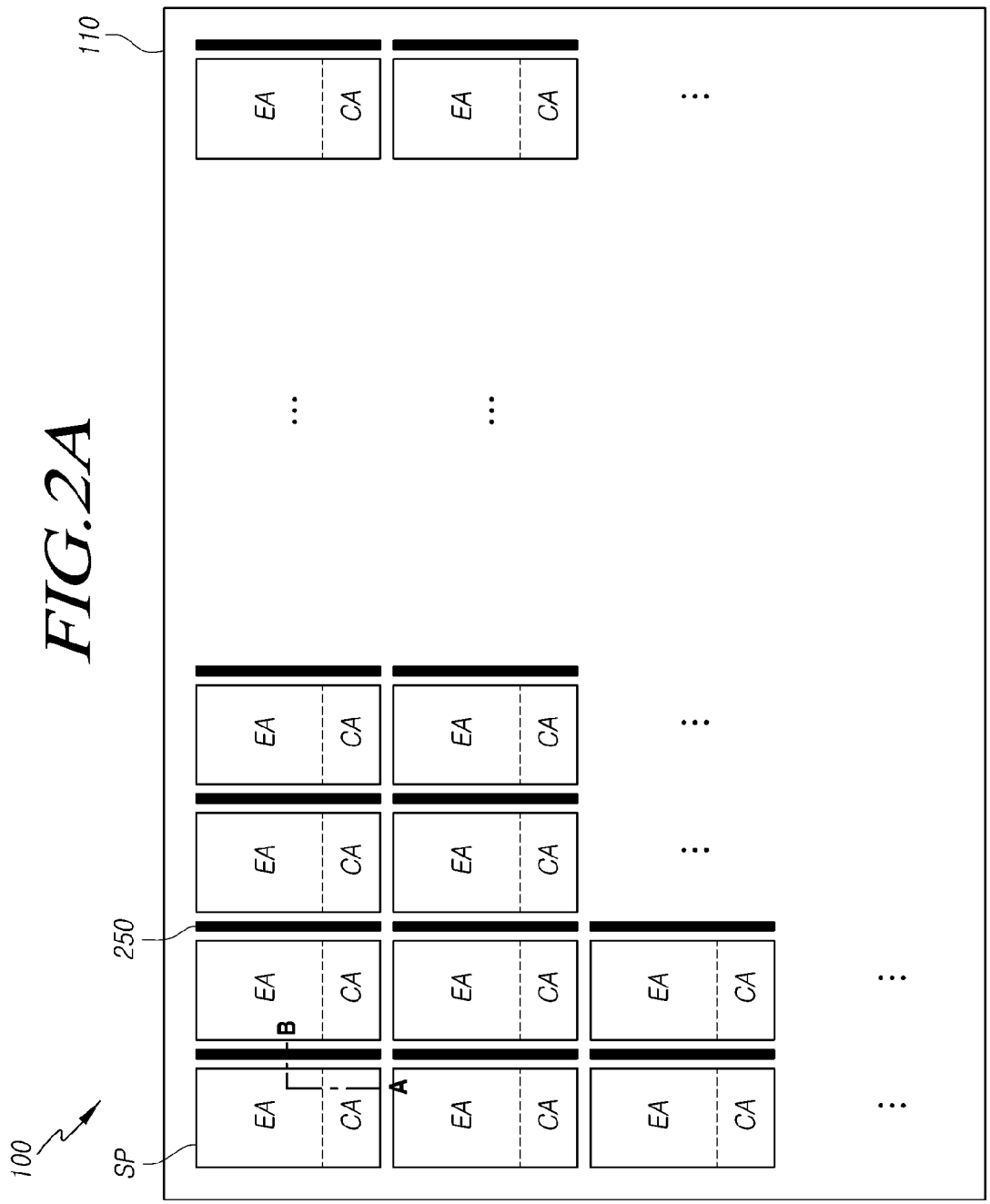

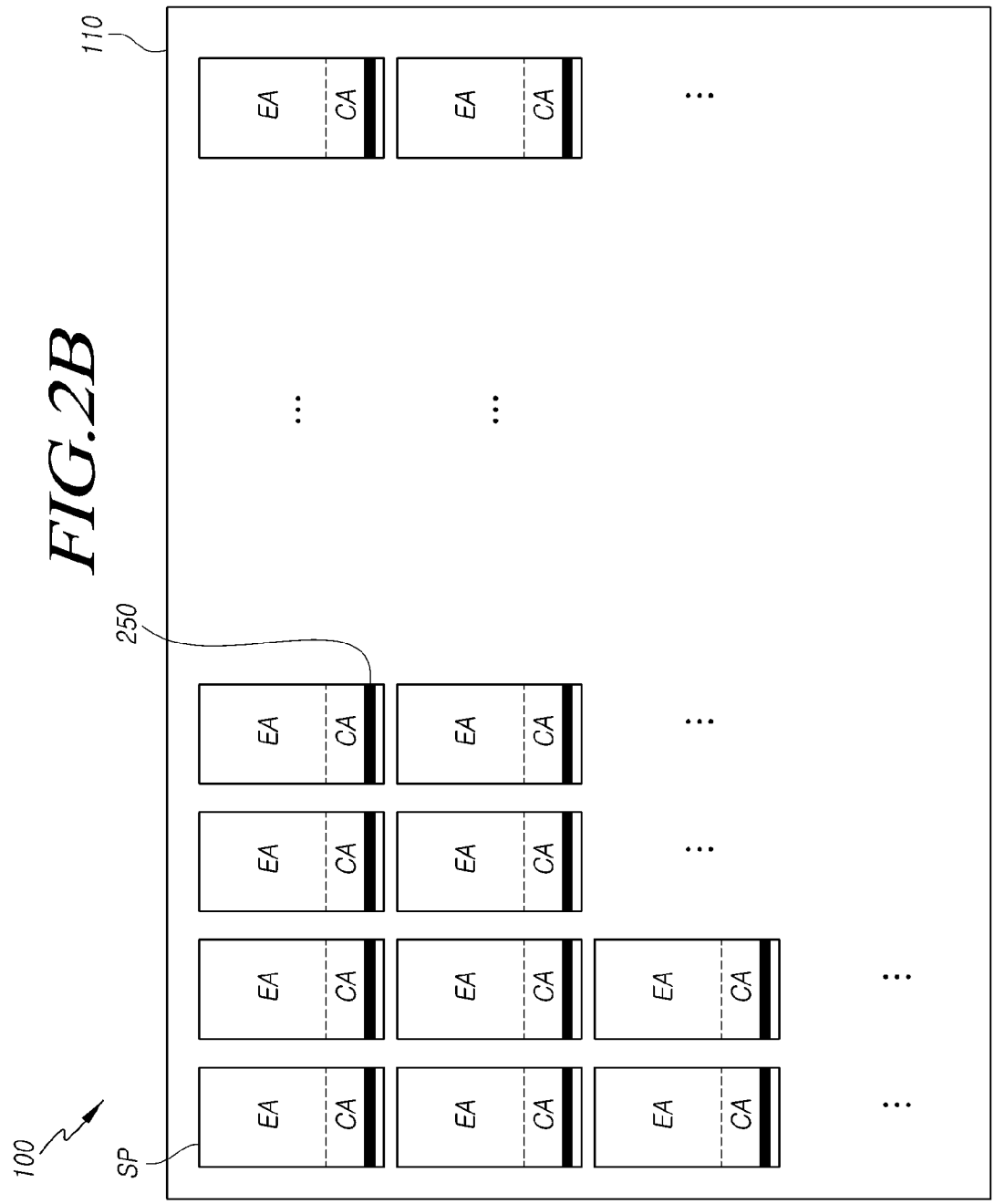

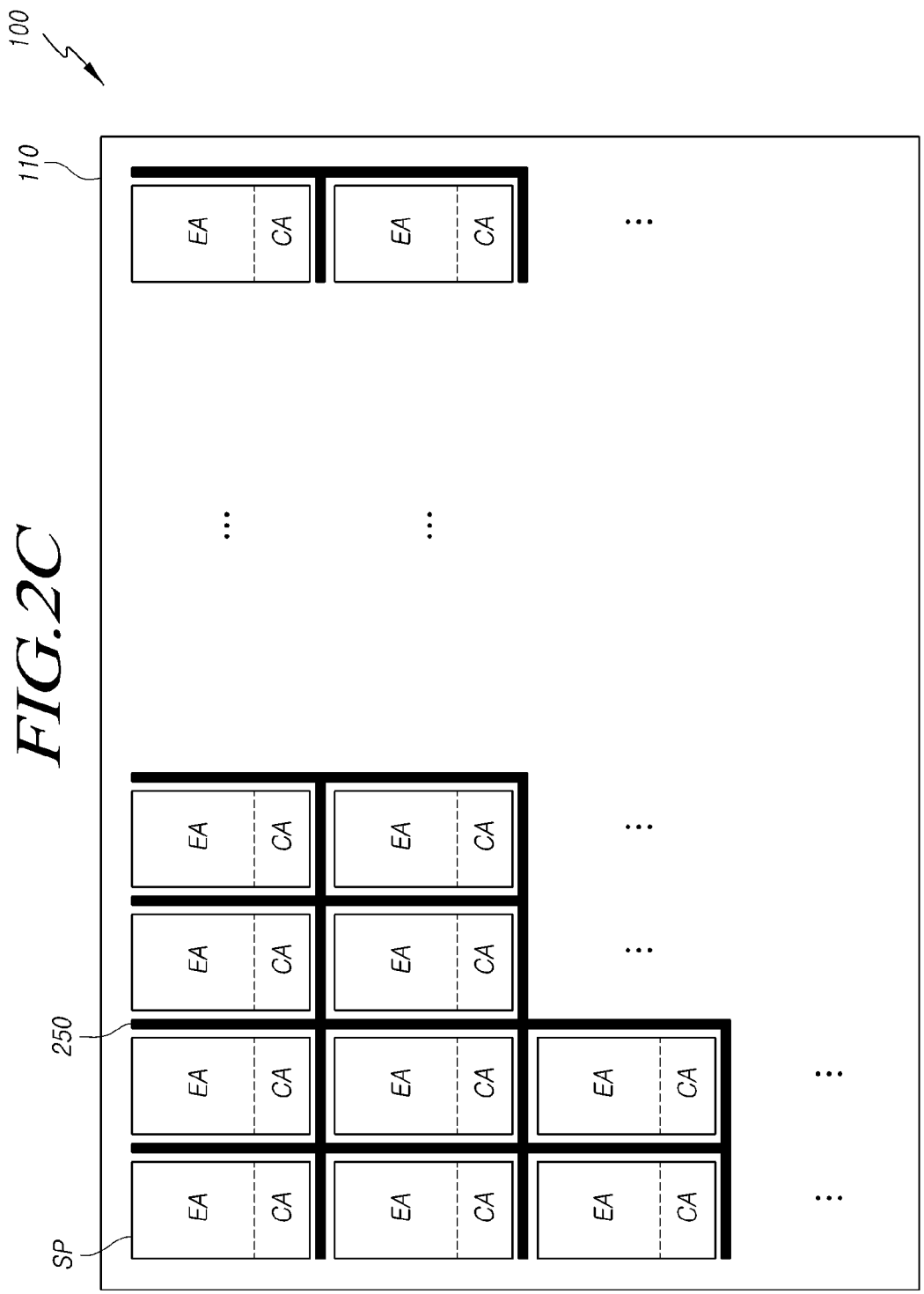

DISPLAY PANEL FOR MAINTAINING PARALLEL SUBSTRATES WITH CONSTANT SPACE AND DISPLAY DEVICE INCLUDING THE SAME

CROSS-REFERENCE TO RELATED APPLICATION

This application claims the priority benefit of Korean Patent Application No. 10-2017-0165954, filed on Dec. 5, 2017 in the Korean Intellectual Property Office, the disclosure of which is incorporated herein by reference in its entirety.

BACKGROUND

Field of the Disclosure

The present disclosure relates to a display device, and more particularly, to a display panel and a display device including the same. Although the present disclosure is suitable for a wide scope of applications, it is particularly suitable for achieving a display panel with a slim and bendable structure.

Description of the Background

As the information society has been developed, various needs for display devices for displaying an image have increased. Recently, various types of display devices, such as Liquid Crystal Display (LCD), Plasma Display Panel (PDP), and Organic Light Emitting Display (OLED) devices, have been developed and utilized.

The display devices may include a first substrate (lower substrate) and a second substrate (upper substrate) arranged parallel to each other with a gap. However, if the two substrates are not parallel to each other, problems may occur.

For example, if two substrates are not parallel to each other in a liquid crystal display device, liquid crystals adjacent to a surface of the substrates are arranged parallel to a bending direction and, therefore, can be arranged differently from an initial state as a whole. In this case, since the arrangement of such liquid crystals does not maintain the initial black state, the light passing through a liquid crystal layer in which such liquid crystals are located rotates while experiencing a retardation different from light passing through a normal area, and as a result, a light leakage can occur.

In addition, the organic light emitting display device among the display devices described above includes a first spacer required to support a mask used during a process of forming a light emitting layer. In a case where such an organic light emitting display device is a bendable, foldable or flexible display device, the display device further needs to include a second spacer capable of securing a light emitting layer so that the light emitting layer is not delaminated when the display device is bended, folded, or flexed by an external force.

However, since the first spacer supporting the mask is rubbed by the mask during a process, as a result, foreign substances may be generated. In addition, in a case where the first and second spacers have the same height, they may be rubbed by the mask when a process for growing the light emitting layer is performed. Accordingly, it is required that the first spacer has a greater height than the second spacer to prevent the second spacer from being rubbed by the mask when the process is performed.

However, in this case, since the thickness of the display device increases due to the height of the first spacer, there is a problem that it is difficult to slim down the overall thickness of the display device.

SUMMARY

Accordingly, the present disclosure to provide a display device having a structure in which an upper substrate and a lower substrate are disposed in spaced, parallel relation to each other when the display device includes the upper and lower substrates.

In addition, the present disclosure to provide a display device having a structure preventing, from being generated, foreign substances caused by a spacer included in a display device which can be bent, and, at the same time, capable of increasing the quality of displayed images by preventing a light emitting layer from being delaminated.

Further, the present disclosure to provide a display device having a structure capable of slimming a display device which can be bent.

According to an aspect consistent with various aspects, provided is a display device including a first electrode disposed on a substrate, a bank disposed in such a way that a part of an upper surface of the first electrode exposes, at least one spacer disposed on the bank, and a second electrode disposed on a light emitting layer disposed on the exposed part of the upper surface of the first electrode. An outer edge of the spacer includes a first outer portion (or edge portion) corresponding from the bank to a first height above the bank and a second outer portion corresponding to a predetermined height from the first height.

In this case, the first outer portion has a second tapering shape, and the second outer portion includes a part having a first tapering shape or a part having a convex shape.

All or a part of the first outer portion of the spacer exposes by the light emitting layer. The all or part of the first outer portion exposed by the light emitting layer contacts a second electrode.

A plurality of spacers, which are disposed on the bank, are disposed on the substrate and include at least one spacer different from one another in size or shape.

According to another aspect consistent with various aspects, provided is a display device including a first electrode disposed on a substrate, a bank disposed in such a way that a part of an upper surface of the first electrode exposes, at least one protruding member disposed on the bank, and a second electrode disposed on a light emitting layer disposed on the exposed part of the upper surface of the first electrode. The protruding member includes at least one variation portion at which an outer circumference of the protruding member being increased at each height as the protruding member extends away from the bank may decrease.

According to yet another aspect consistent with various aspects, provided is a display device including a first substrate, a second substrate and at least one spacer disposed on any one substrate of the first and second substrates, and the spacer includes a first part disposed on the any one substrate and a second part disposed on the first part. The width of the first part increases as the spacer extends away from a bank or a substrate, and the width of the second part decreases as the spacer extends away from the bank or the substrate.

According to the various aspects of the present disclosure as described above, provided is a display device having a structure in which an upper substrate and a lower substrate are disposed in spaced, parallel relation to each other when the display device includes the upper and lower substrates.

According to the various aspects of the present disclosure, provided is a display device having a structure preventing, from being generated, foreign substances caused by the spacer included in a display device which can be bent, and, at the same time, capable of increasing the quality of displayed images by preventing a light emitting layer from being delaminated.

According to the various aspects of the present disclosure, provided is a display device having a structure capable of achieving a slim display panel which can be bent.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIGS. 2A to 2C are schematic views illustrating arranged configurations of a plurality of subpixels and one or more spacers in a display panel of the display device according to aspects of the present disclosure;

DETAILED DESCRIPTION

Figure 1:
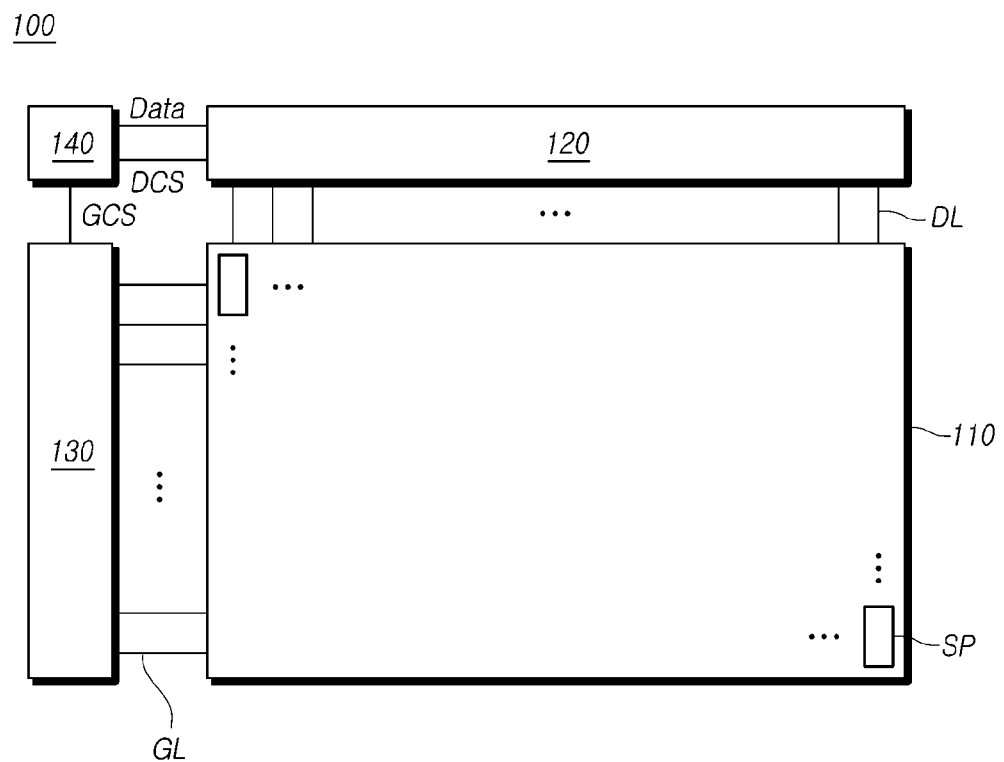
FIG. 1 is a block diagram schematically illustrating a display device according to aspects of the present disclosure.

Hereinafter, the present disclosure will be described in detail with reference to the accompanying drawings. In denoting elements of the drawings by reference numerals, the same elements will be referenced by the same reference numerals although the elements are illustrated in different drawings. In the following description of the disclosure, detailed description of known functions and configurations incorporated herein may be omitted when it may make the subject matter of the disclosure rather unclear.

Terms, such as first, second, A, B, (a), or (b) may be used herein to describe elements of the disclosure. Each of the terms is not used to define essence, order, sequence, or number of an element, but is used merely to distinguish the corresponding element from another element. When it is mentioned that an element is "connected" or "coupled" to another element, it should be interpreted that another element may be "interposed" between the elements or the elements may be "connected" or "coupled" to each other via another element as well as that one element is directly connected or coupled to another element.

When a positional relationship of two elements or layers is described using, for example, "on," "above," "beneath," "below," "beside," or the like, another element or layer may be positioned not only directly on an element or layer, but between the two elements or layers unless a term such as, "contact" or "directly on" is used.

Spatially relative terms, such as "below" or "beneath," "lower," "above," "upper", or the like, can be used to easily describe the correlation an element or layer and another element or layer, as illustrated in drawings. When the especially relative terms are used, it should be interpreted that the terms include other directions of an element or layer when used or operated as well as a direction illustrated in drawings. For example, when an element illustrated in a drawing is inverted, an element described as "below" or "beneath" of another element may be placed "above" the another element. Therefore, the exemplary term, "below" or "beneath," may include "on," "over," "above," or "upper."

In addition, terms, such as first, second, A, B, (a), or (b) may be used herein to describe elements of the disclosure. Each of the terms is not used to define essence, order, sequence, or number of an element, but is used merely to distinguish the corresponding element from another element.

FIG. 1 is a block diagram schematically illustrating a display device according to aspects of the present disclosure.

Referring to FIG. 1, a display device 100 according to aspects of the present disclosure includes a display panel 110 in which a plurality of data lines DL and a plurality of gate lines GL are disposed, and at least one subpixel SP is disposed, which is defined by a plurality of data lines DL and a plurality of gate lines GL, a data driving circuit 120 driving a plurality of data lines DL, a gate driving circuit 130 driving a plurality of gate lines GL, and a controller 140 controlling the data driving circuit 120 and the gate driving circuit 130.

The display device 100 according to aspects of the present disclosure may be an organic light emitting display device, a liquid crystal display device, a plasma display device, or the like.

In instances where a display device 100 according to aspects of the present disclosure is an organic light emitting display device, each subpixel SP disposed in the display panel 110 may be composed of an organic light emitting diode (OLED) which is a self-emitting device, a driving transistor for driving the organic light emitting diode (OLED), and/or the like.

The type and number of one or more circuit elements composing each subpixel SP may be defined variously according to a function to be performed and a design method.

A display device 100 will be described below as an organic light emitting display device, but aspects according to the present disclosure are not limited thereto.

Meanwhile, the display panel 110 of the display device may include a light emitting layer constituting the organic light emitting diode OLED.

A mask may be used to form such a light emitting layer. However, in the process of forming a light emitting layer using a mask, a mask sagging phenomenon may occur and result in a low yield, and, therefore, a mask support member can be used to prevent such a mask sagging phenomenon.

In addition, in a case where a great external force is applied or an external force is continuously applied to the display device 100, or a bendable display device 100 is bended repeatedly, a delamination of the light emitting layer can occur.

This is resulted from a weak adhesion between the light emitting layer and one or more elements or layers located under the light emitting layer, and, when a great or continuous external force is applied to the display device 100 including the light emitting layer, or the display device 100 is repeatedly bended, the light emitting layer may be delaminated from the one or more elements or layers located under the light emitting layer.

Meanwhile, a deposition of the light emitting layer by evaporation may result in a state of weak adhesion with one or more elements or layers located under the light emitting layer due to a weak adhesion resulted from the deposition by evaporation.

The display device 100 according to aspects of the present disclosure provides a protruding member or a spacer serving as a support member capable of supporting a mask in the process of forming a light emitting layer, and, at the same time, preventing the light emitting layer from being delaminated.

The protruding member may have the same configuration as the spacer. The protruding member and/or the spacer may be a protruded configuration located on a bank in a non-display area or a non-light-emitting area of the display device. Hereinafter, for convenience of description, the term "spacer" will be used and is intended to include the protruding member.

FIGS. 2A to 2C are views schematically illustrating arranged configurations of a plurality of subpixels and one or more spacers in a display panel of a display device according to aspects of the present disclosure.

Referring to FIGS. 2A to 2C, the display device 100 according to aspects of the present disclosure includes a display panel 110, and the display panel 110 includes a plurality of subpixels SP arranged in a matrix form.

Although FIGS. 2A to 2C illustrate a plurality of subpixels SP arranged in a matrix form, such configurations are various examples and, therefore, a plurality of subpixels SP in a display panel according to aspects of the present disclosure may be arranged in various configurations.

Meanwhile, although not illustrated in FIGS. 2A to 2C, at least one line may be located between one subpixel SP and another subpixel SP disposed adjacent to the one subpixel. For example, the at least one line may be, but not limited to, any one of a date line and a gate line, or a reference voltage line or a drive voltage line located between one subpixel SP and another subpixel SP disposed adjacent to the one subpixel.

One subpixel SP may include a light emitting area EA and a circuit area CA in which one or more circuits may be located for driving an organic light emitting diode OLED.

In the display panel 110, all remaining area except for the light emitting area EA included in the subpixel SP may be a non-light-emitting area.

Meanwhile, as illustrated in FIGS. 2A to 2C, a display panel 110 according to aspects of the present disclosure may include at least one spacer 250.

Referring to FIG. 2A, a spacer 250 may be disposed in at least one side of at least one subpixel SP. In this case, the spacer 250 may be disposed to overlap a line disposed at least one side of a subpixel SP.

In addition, referring to FIG. 2B, a spacer 250 may be located in a circuit area CA in a subpixel SP in a display panel 110 according to aspects of the present disclosure.

That is, the spacer 250 may be located in the remaining area EA, a non-light-emitting area, except for a light emitting area EA. In other words, the position of a spacer 250 according to aspects of the present disclosure is not limited to FIGS. 2A and 2B, and a non-light-emitting area provides an enough area for the spacer to be located.

Since a spacer 250 is located so as not to cover the light emitting area EA, the light emitting area EA by the spacer is not reduced by the spacer 250.

In addition, although FIGS. 2A and 2B illustrate that the display panel 110 is provided with a plurality of spacers 250, the present disclosure is not limited thereto. For example, as illustrated in FIG. 2c, a mesh configuration may be provided in such a way that one spacer 250 is disposed only in a non-light-emitting area.

Figure 3:
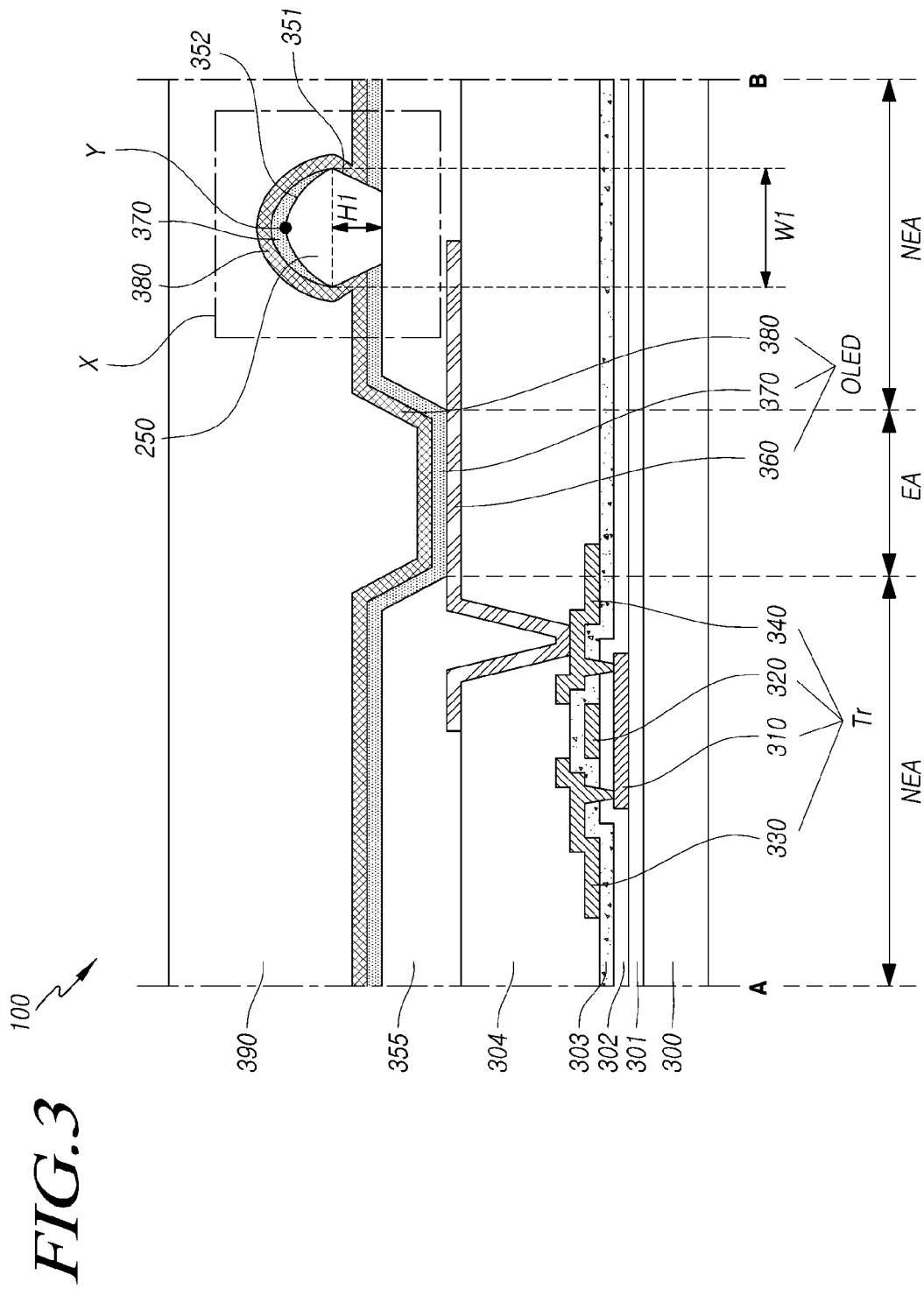
FIG. 3 is a cross-sectional view taken along with line A-B of FIG. 2A.

Referring to FIG. 3, a location and role of the spacer 250 according to aspects will be discussed in detail below.

FIG. 3 is a cross-sectional view taken along with line A-B of FIG. 2A.

Referring to FIG. 3, a display device 100 according to aspects of the present disclosure includes a thin film transistor Tr disposed on a substrate 300, an organic light emitting diode OLED electrically connected to the thin film transistor Tr and a spacer 250 disposed in a non-light-emitting area NEA.

In this case, the thin film transistor Tr includes an active layer 310, a gate electrode 320, a source electrode 330 and a drain electrode 340. The organic light emitting diode OLED includes a first electrode 360, a light emitting layer 370 and a second electrode 380.

The arrangement relationship of configurations, elements or layers disposed on the substrate 300 will be discussed in detail below.

A buffer layer 301 is disposed on the substrate 300. An active layer 310 is disposed on the buffer layer 301. A gate insulating layer 302 is disposed on the active layer. A gate electrode 320 overlapping the active layer 310 is disposed on the gate insulating layer 302. An interlayer insulating layer 303 is disposed on the gate electrode 320. A source electrode 330 and a drain electrode 340 connected to the active layer 310 through a contact hole provided in the interlayer insulating layer 303 and the gate insulating layer 302 are disposed on the interlayer insulating layer 303.

Although the gate electrode 320, the source electrode 330 and the drain electrode 340 are illustrated as a single layer in FIG. 3, the present disclosure is not limited thereto and, therefore, all or each of the electrodes may be composed of a multilayer.

In addition, although the gate electrode 320 is disposed on the active layer 310 in FIG. 3, the present disclosure is not limited thereto and, therefore, the active layer 310 may be disposed on the gate electrode 320.

An overcoat layer 304 is disposed on the source electrode 330 and the drain electrode 340. A first electrode 360 of an organic light emitting diode OLED is disposed on the overcoat layer 304. The first electrode 360 may be electrically connected to the drain electrode 340 of the thin film transistor Tr through a contact hole provided in the overcoat layer 304.

Meanwhile, although the first electrode 360 is connected to the drain electrode 340 in FIG. 3, the present disclosure is not limited thereto and, therefore, the first electrode 360 may be connected to the source electrode 330.

A bank 355 is disposed on the overcoat layer 355 and the first electrode 360. The bank may be located between a light emitting area EA and a non-light-emitting area NEA, and distinguish the light emitting area EA from the non-light-emitting area NEA. Specifically, an area corresponding to an area in which the bank 355 is located may be the non-light emitting area NEA, and an area corresponding to an area in which the bank 355 is not located may be the light emitting area EA.

The bank 355 may be disposed in a way that a part of an upper surface of the first electrode 360 exposes. In addition, at least one spacer 250 is located on the bank 355.

A light emitting layer 370 is disposed on the bank 355, the exposed part of the first electrode 360 caused by the bank 355 and a part of an outer edge of a spacer 250. A second electrode 380 is disposed on the light emitting layer 370 and the spacer 250.

An encapsulation layer 390 is disposed on the second electrode 380, to prevent the organic light emitting diode OLED from foreign substances, such as moisture, or the like.

Although the encapsulation layer 390 is illustrated as a single layer in FIG. 3, the present disclosure is not limited thereto and, therefore, the encapsulation layer 390 may be composed of a multilayer. If the encapsulation layer 390 may be formed of a multilayer with an organic layer and an inorganic layer disposed alternately.

Meanwhile, a spacer 250 according to the present disclosure includes a first outer portion or a first part corresponding from the bank 355 to a first height H1 above the bank 355 and a second outer portion 352 or a second part corresponding to a predetermined height from the first height H1.

Specifically, the first height H1 may be a vertical height from the top surface of the bank 355 to a point at which the spacer 250 has the maximum width W1.

The first outer portion 351 has a second tapering shape in which the width of the spacer increases as the spacer extends away from the bank 355 or the substrate and the second outer portion 352 includes a part having a first tapering shape in which the width of the spacer decreases as the spacer extends away from the bank 355 or the substrate, or a part having a convex shape.

The second outer portion 352 of the spacer 250 may serve to support a mask used when a light emitting layer 370 is formed on the substrate 300.

In this case, since the second outer portion 352 includes the part having the first tapering shape on a side surface thereof or the part having the convex shape, the area of the second outer portion 352 contacting the mask can be reduced. For example, the second outer portion 352 may make point contact with the mask.

Specifically, a point Y farthest away from the bank 355 contacts the mask in the second outer portion 352 of the spacer 250. In the aspects of the present disclosure, a surface area at the point Y farthest away from the bank 355 in the second outer portion 352 of the spacer 250 reduces and, thus, the area contacting the mask is minimized.

Meanwhile, as an area of the spacer 250 contacting the mask increases, an area of the spacer 250 being rubbed during a process increases, and as a result, a quantity of foreign substances generated also increases. However, in the display device 100 according to the aspects of the present disclosure, since the area of the spacer 250 contacting the mask is minimized, the generating of the foreign substances resulted from rubbing of the spacer 250 with the mask can be prevented.

In addition, if, as the second outer portion 352 of the spacer 250 extends away from the bank 355, the width of the second outer portion 352 increases, the maximum width of the second outer portion 352 may be located a point farthest away from the bank 355. That is, the mask can be supported at a point at which the second outer portion 352 has the maximum width.

Accordingly, the second outer portion 352 at a point farthest away from the bank 355 may protrude from other points of the second outer portion 352. However, in this case, the mask may be caught by the protruding point of the second outer portion 352, and, as a result, the mask may be damaged or the spacer 250 may be separated from the bank 355.

In addition, the first outer portion 351 of the spacer 250 according to aspects of the present disclosure has the second tapering shape, and therefore, the light emitting layer 370 may be disposed in a way that a part of an outer edge of the spacer 250 exposes Specifically, the light emitting layer 370 may be disposed in a way that all or a part of the first outer portion 351 of the spacer 250 exposes, and/or be disposed on the second outer portion 352 of the spacer 250.

Such a structure is resulted from the outer edge shape of the spacer 250 and process characteristics of the light emitting layer 370.

The light emitting layer 370 may be disposed on the first electrode 360, the bank 355, and a substrate 100 in which the spacer 250 is disposed. In this case, the light emitting layer 370 may be growth by a coating or deposition method having straightness. For example, the light emitting layer may be growth by evaporation.

In this way, to grow the light emitting layer 370, a substance to compose the light emitting layer 370 is required to be evaporated inside a chamber. The first electrode 360, bank 355 and spacer 250 are located to face the substance of the light emitting layer 370, spaced away from the substance of the light emitting layer 370 on a substance of the light emitting layer 370 in the chamber.

The substance of the light emitting layer 370 evaporated while having straightness in the chamber faces a substrate 100 in which the first electrode 360, the bank 355, and the spacer 250 are disposed.

The substance of the light emitting layer 370 is formed on the bank 355, the exposed part of the first electrode 360 caused by the bank 355 and the second outer portion 352 of the spacer 250, and thus the light emitting layer 370 is provided.

Meanwhile, it is difficult for the substance of the light emitting layer 370 to reach the first outer portion 351 located at an upper vertical height than an area in which the spacer 250 has the maximum width in the chamber. Specifically, the area in which the spacer 250 has the maximum width blocks all or a part of the substance of the light emitting layer 370 evaporated while having straightness, and as a result, the substance of the light emitting layer 370 may not reach the first outer portion 351 or may reach only a part of the first outer portion 351.

Accordingly, the light emitting layer 370 finally formed may be disposed in such a way that all or a part of the first outer portion 351 of the spacer 250 exposes.

Meanwhile, the second electrode 380 may be formed in a way that the orientation of the deposition substance may not be uniform. For example, the second electrode 380 may be formed by a sputtering method.

Such a method provides an excellent step coverage and has a characteristic that a substance is deposited along the outer edge shape of the substrate to be deposited. Accordingly, even if the spacer 250 including the first outer portion 351 having the second tapering shape is disposed on the substrate 300, the second electrode 380 may be formed along the outer surface of the first outer portion 351.

Accordingly, the second electrode 380 formed may be finally located on the light emitting layer 370, and the first outer portion 351 and the second outer portion 352, of the spacer 250. Specifically, the second electrode 380 may be disposed to contact a first outer portion of the spacer 250 exposed by the light emitting layer 370.

Hereinafter, an arrangement structure of the spacer 250, light emitting layer 370 and second electrode 380, described above, will be discussed in detail, referring to FIGS. 4 and 5.

Figure 4:
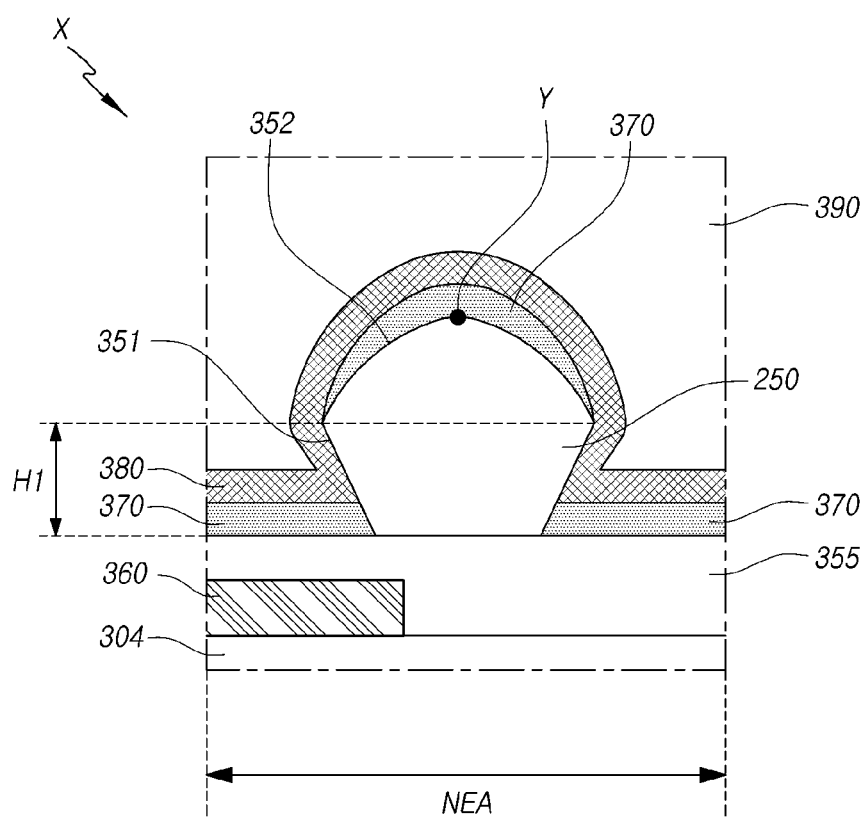
FIG. 4 is an enlarged view of an X portion in FIG. 3.

FIG. 4 is an enlarged view of an X portion in FIG. 3. FIG. 5 is a view illustrating another aspect on an arrangement structure of a spacer, a light emitting layer and a second electrode in an area corresponding to the X portion of FIG. 3.

Referring to FIG. 4, the spacer 250, the light emitting layer 370 and the second electrode 380 are disposed on the bank 355.

The spacer 250 includes a first outer portion 351 corresponding from the surface of the bank 355 to a first height H1 above the bank 355 and a second outer portion 352 corresponding to a predetermined height from the first height H1.

The light emitting layer 370 is disposed in such a way that a part of the outer edge of the spacer 250 exposes. Specifically, the light emitting layer 370 may be disposed in a way that a part of the first outer portion 351 of the spacer 250 exposes. In addition, the light emitting layer 370 is disposed on the second outer portion 352 of the spacer 250.

That is, as illustrated in FIGS. 3 and 4, the light emitting layer 370 may be disposed on the bank 355, the exposed part of the first electrode 360 caused by the bank 355, the part of the first edge of the spacer 250 and/or the second outer portion 352 of the spacer 250. In other words, the light emitting layer 370 may not be disposed in an area corresponding to a part of the first outer portion 351 of the spacer 250.

The deposition of the light emitting layer 370 by evaporation results in a state of weak adhesion with one or more elements or layers located under the light emitting layer.

In particular, adhesion may be weak between the light emitting layer 370 and the first electrode 360 in a light emitting area EA or the light emitting layer 370 and the bank 355 in a non-light-emitting area NEA.

Because of this, when a great external force is applied or an external force is continuously applied to the display device 100, the light emitting layer 370 may be delaminated from the first electrode 360 in the light emitting area EA or from the bank 355 in the non-light-emitting area NEA.

Specifically, in a case where an external force is applied to the display device 100, a stress which works against the external force in the light emitting layer 370 generates, and, when the light emitting layer 370 cannot withstand this stress, the light emitting layer 370 is delaminated from the first electrode 360 or the bank 355.

However, as illustrated in FIGS. 3 and 4a, in the display device 100 according to aspects of the present disclosure, since the light emitting layer 370 is not disposed in a part of the first outer portion 351 of the spacer 250, therefore the portion of the light emitting layer 370 receiving the external force reduces.

Accordingly, such a phenomenon that a great stress occurs in the light emitting layer 370 reduces and, therefore, the delamination of the light emitting layer 370 can be inhibited from the first electrode 360 or the bank 355.

In addition, the deposition of the second electrode 380 with the light emitting layer 370 and the spacer 250 results in a strong adhesion state. Accordingly, the second electrode 380 may serve to secure the light emitting layer 370 so that it is not delaminated.

In particular, since the second electrode 380 is disposed to contact an exposed area of the spacer 250 in which the light emitting layer 370 is not disposed, the second electrode 380 secures the light emitting layer 370 in even an end portion in which the light emitting layer 370 is not disposed due to the space 250, and, therefore, prevented is the delamination of the light emitting layer 370.

Meanwhile, in FIGS. 3 and 4, although the light emitting layer 370 is disposed in a way that a part of the first outer portion 351 of the spacer 250 exposes in the non-light-emitting area NEA, the present disclosure is not limited thereto.

Figure 5:
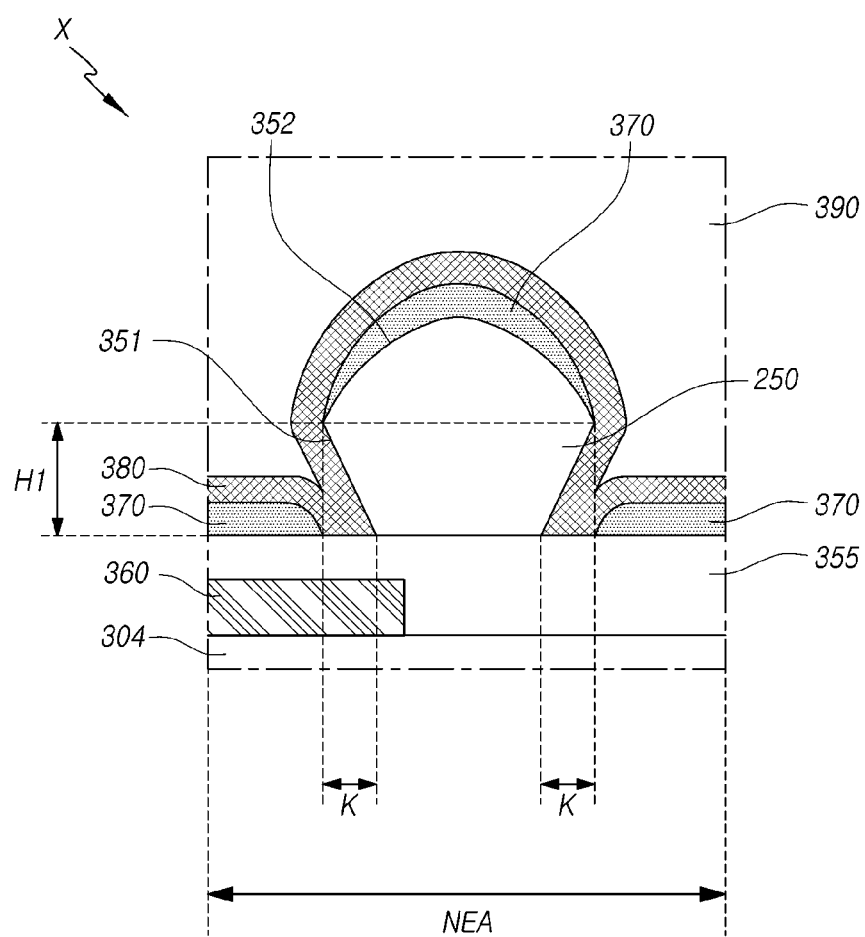
FIG. 5 is a view illustrating another aspect on an arrangement structure of a spacer, a light emitting layer and a second electrode in an area corresponding to the X portion of FIG. 3.

As illustrated in FIG. 5, the light emitting layer 370 may be disposed in a way that all of the first outer portion 351 of the spacer 250 exposes in the non-light-emitting area NEA In addition, the light emitting layer 370 may be disposed in a way that a part of the upper surface of the bank 355 in the non-light-emitting area NEA exposes. Specifically, the light emitting layer 370 may be disposed in a way that the upper surface of the bank 355 exposes by a width K from the end portion of the first outer portion 351 of the spacer 250 to a point in which the spacer 250 has a maximum width, that is, the point corresponding to a first height H1 from the surface of the bank 355.

That is, in accordance with an aspect of the present disclosure, an area in which the bank 355 exposes by the light emitting layer 370 may increase as the maximum width of the spacer 250 increases.

The spacer 250 including the first outer portion 351 having the second tapering shape and the second outer portion 352 having the first tapering shape can be formed only by one exposure process.

A method for growing such a spacer 250 will be discussed below referring to FIGS. 6 and 7.

Figure 6:
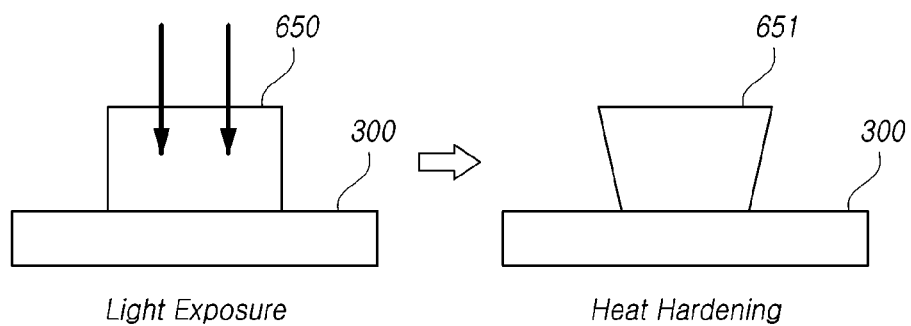
FIGS. 6 and 7 are block diagrams schematically illustrating a method of forming a spacer according to aspects of the present disclosure.
Figure 7:
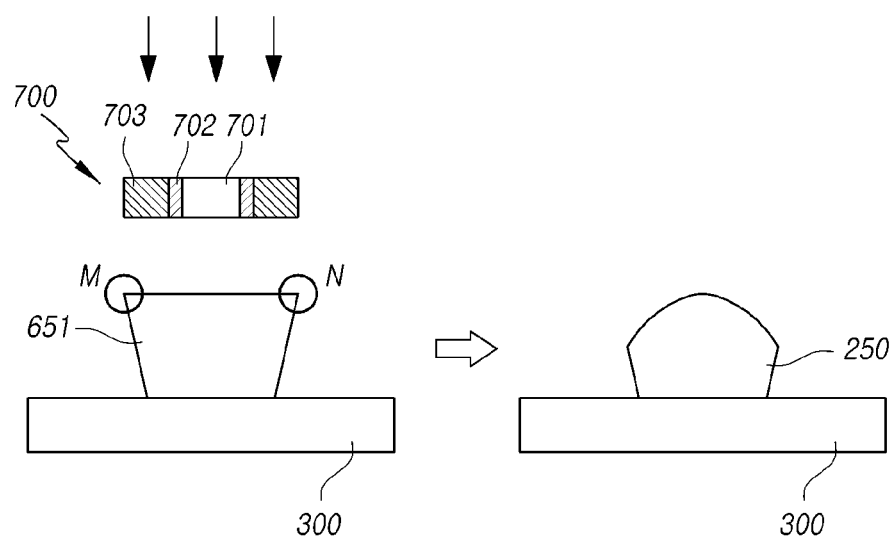

FIGS. 6 and 7 are block diagrams schematically illustrating a method of growing a spacer according to aspects of the present disclosure.

Referring to FIGS. 6 and 7, a substance to compose the spacer 650 is formed on the substrate 300.

A large amount of light is irradiated to the upper portion of the material to compose spacer 650 and a lower amount of light is irradiated to the lower portion of the material to compose the spacer 650 than the upper portion.

Meanwhile, the substance composing the spacer 650 may be a substance generating acids when exposed to light, or may be composed of dyes or pigments which, when exposed to light, produce acids. In particular, in a highly lighted area, the substance composing the spacer 650 can generate a large quantity of acids.

The acids generated from the substance to compose the spacer 650 may promote hardening of the substance to compose the spacer 650.

As described above, when the substance to compose the spacer 650 is irradiated with a different amount of light by area, and then heated, the center portion of the substance to compose the spacer 650 has a high degree of hardening and an area between the center portion and the edge portion has a lower degree of hardening than the center portion, and therefore, the edge portion hardly hardens.

When such a substance to compose the spacer 650 is developed, since the substance located in the edge portion, which is hardly harden, is rubbed more than a substance located in other areas, therefore a spacer pattern 651 having the second tapering shape can be formed, as illustrated in FIG. 6.

In FIG. 7, a substrate 300 on which a spacer pattern 651 having the second tapering shape is formed is located to face a mask 700. The mask 700 may include a first portion to a third portion 701, 702 and 703. In this case, the first portion 701 is an area entirely transmitting light, the second portion 702 is an area partially transmitting light, and third portion 703 is an area blocking light, when light is irradiated to the substrate 300.

That is, the maximum amount of light reaches the spacer pattern 651 located in the area corresponding to the first portion 701 of the mask 700, the amount of light reaching the spacer pattern 651 located in the area corresponding to the second portion 702 is smaller than the amount of light reaching the spacer pattern 651 located in the region corresponding to the first portion 701, and light hardly reaches the spacer pattern 651 located in the area corresponding to the third portion 703.

In addition, one or more protruding portions M, N provided in the upper portion of the spacer pattern 651 having the second tapering shape serve to block light incident on the spacer pattern 651, and thus interfere that light reaches a lower portion of the spacer pattern 651.

Accordingly, different amounts of light according to the respective areas reach the spacer pattern 651. Specifically, in the upper portion of the spacer pattern 651, the maximum amount of light reaches the center portion, the amount of light reaching between the center portion and the edge portion of the spacer pattern 651 is smaller than the amount of light reaching the center portion, and light hardly reaches the edge portion of the spacer pattern 651.

In addition, light hardly reaches a lower portion of the spacer pattern 651.

Accordingly, a high degree of hardening may occur in the edge portion of the upper portion of the spacer pattern 651 and a lower portion of the spacer pattern 651, hardening in the area between the center portion and the edge portion, of the upper portion of the spacer pattern 651, may occur to a lower degree than the edge portion of the upper portion of the spacer pattern 651 and the lower portion of the spacer pattern 651, and hardening may hardly occur in the center portion of the upper portion of spacer pattern 651.

When such a spacer pattern 651 is developed, the substance located in the center portion of the upper portion of the spacer pattern 651 in which hardening hardly occurs is most rubbed, and the substance located in the area between the center portion of the upper portion and the edge portion, of the spacer pattern 651 is rubbed. As illustrated in FIG. 7, a spacer 250 is formed in which the upper portion thereof has the first tapering shape, and the lower portion thereof has the second tapering shape.

Figure 8:
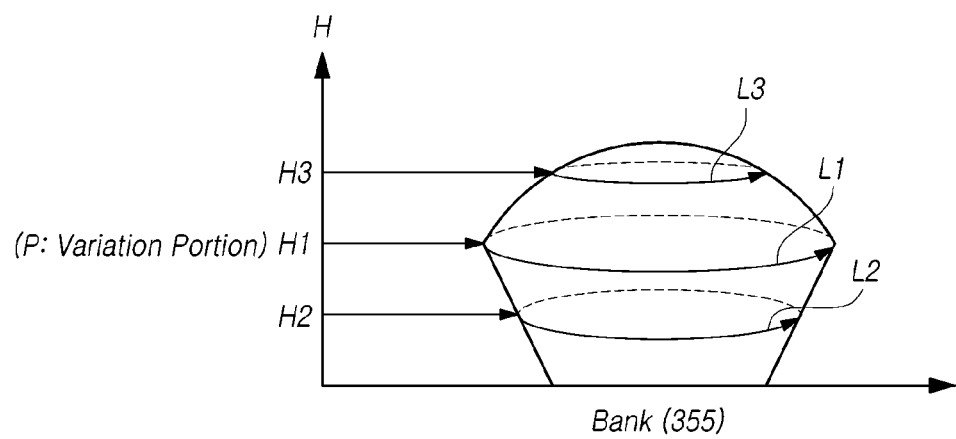
FIG. 8 is a view illustrating circumferences at respective heights or regions of a spacer according to aspects of the present disclosure.
Figure 9:
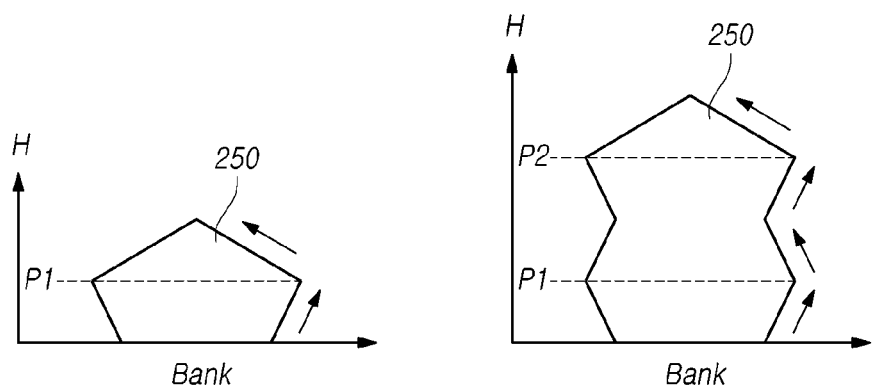
FIG. 9 is a view illustrating inflection points of a spacer according to aspects of the present disclosure.

Such a spacer 250 has different outer edge characteristics for each area. Referring to FIGS. 8 and 9, these characteristics will be discussed below.

FIG. 8 is a view illustrating the circumferences at respective heights or regions of a spacer according to the aspects of the present disclosure.

Referring to FIG. 8, the spacer may include at least one variation portion P at which the outer circumference of the spacer 250 being increased or decreased at each height as the spacer extends away from the bank may vary.

Specifically, the spacer may include at least one variation portion P at which the outer circumference of the spacer 250 being increased at each height as the spacer extends away from the bank may decrease.

The spacer 250 according to aspects of the present disclosure may have a point corresponding to a first height H1 relative to the bank 355 as inflection points P at which the outer circumference of the spacer 250 being increased may decrease.

Accordingly, a circumference L2 of the spacer 250 at a second height H2 located at a lower vertical height than the first height H1 and a circumference L3 of the spacer 250 at a third height H3 located at a higher vertical height than the first height H1 may be smaller than a circumference L1 of the spacer 250 at the first height H1

That is, the outer circumference of the spacer 250 may have the maximum value at inflection points P at which the outer circumference of the spacer being increased may decrease.

Accordingly, at a lower vertical height than the variation portion P of the spacer 250, the second tapering shape may be provided in which the outer circumference increases as the spacer extends away from the bank 355, and, at an upper vertical height than the variation portion P of the spacer 250, the first tapering shape may be provided in which the outer circumference decreases as the spacer extends away from the bank 355.

Meanwhile, the first outer portion 351 of the spacer 250, as described with reference to FIGS. 3 to 5, is a portion in which the outer circumference increases as the spacer extends away from the bank 355, relative to the variation portion P of the spacer 250. In addition, the second outer portion 352 of the spacer 250 is a portion in which the outer circumference decreases as the spacer extends away from the bank 355 relative to the variation portion P of the spacer 250.

Although the spacer 250 having one variation portion P is illustrated in FIG. 8, the spacer 250 according to aspects of the present disclosure is not limited thereto, and a spacer 250 illustrated in FIG. 9 may be applied.

FIG. 9 is a view illustrating inflection points of a space according to aspects of the present disclosure.

Referring to FIG. 9, as described above, a spacer 250 according to aspects of the present disclosure may have at least one variation portion P1 at which the outer circumference of the spacer being increased or decreased may vary.

An outer circumference of a spacer 250 having one variation portion P1 may increase up to the variation portion P1 and then decrease.

In addition, an outer circumference of a spacer 250 having two variation portions P1 and P2 may increase up to the variation portion P1 and then decrease, and again increase up to the variation portion P2 and then decrease.

Although the spacer 250 having one or two variation points is illustrated in FIG. 9, the present disclosure is not limited thereto and the spacer 250 may have three or more variation points.

Accordingly, in a case where a spacer 250 having various heights is required, it is possible to vary the height of a space 250 having one variation point P1, or to vary the height of a space 250 by providing the spacer 250 with a plurality of variation portions P1 to Pn.

Meanwhile, in FIGS. 2 and 3, description is given on a configuration in which one or more spacers 250 are disposed in a way that the spaces 250 correspond to a plurality of subpixels disposed on the display panel 110. However, the locations of the spacers are not limited thereto, and the spacer may be disposed in exemplary locations illustrated in FIG. 10.

Figure 10:
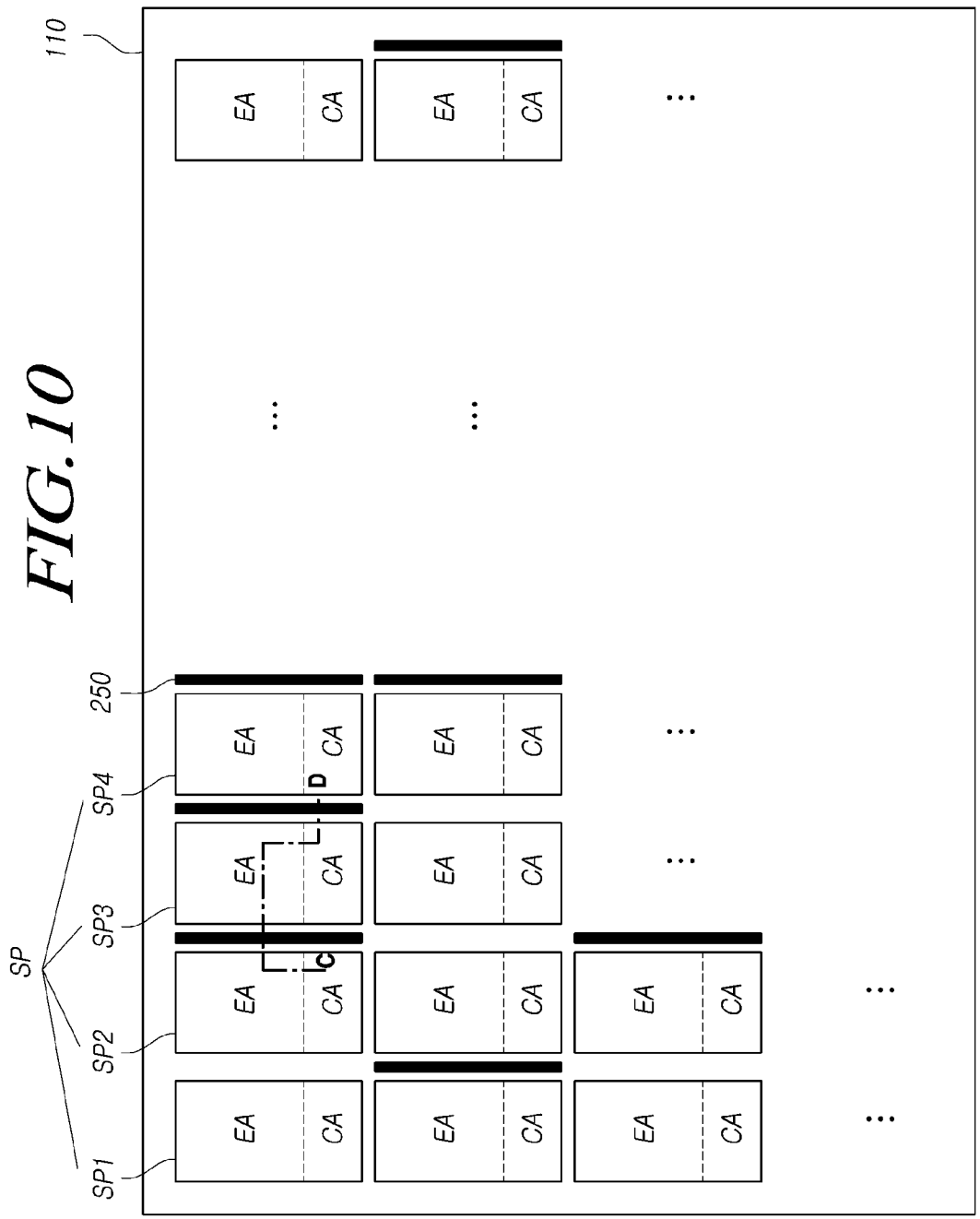
FIG. 10 is a view schematically illustrating arranged configurations of a plurality of subpixels and one or more spacers in a display panel of a display device according to another aspect of the present disclosure.

FIG. 10 is a view schematically illustrating arranged configurations of a plurality of subpixels and one or more spacers in a display panel of a display device according to another aspect of the present disclosure. In the following description, the same or equivalent features, structures, characteristics, components, contents, or configurations as the above-described aspects will not be described repeatedly.

Referring to FIG. 10, a display panel 110 includes a plurality of subpixels SP.

In such a display panel 110, a spacer 250 may be disposed in at least one side of at least one subpixel SP. In this case, the spacer 250 may be disposed to overlap a line disposed at least one side of the subpixel SP.

For example, as illustrated in FIG. 10, the spacer 250 may not be disposed on four sides of a first subpixel SP1 and may be disposed on at least one side of a second subpixel SP2.

The greater the number of spacers 250 disposed in a non-light-emitting area, the higher the probability that a part of the spacer 250 will be formed over a part of a light emitting area EA due to an error during a process. In a case where a part of the spacer 250 is formed over a part of the light emitting area EA, the area of the light emitting area EA can reduce.

However, as illustrated in FIG. 10, if a single spacer 250 is disposed per a plurality of subpixels SP, the number of the spacers 250 can reduce. Accordingly, since the probability that a part of the spacer 250 is disposed over a part of the light emitting area EA due to an error during a process reduces, the spacer 250 can be located only in the non-light-emitting area NEA.

Meanwhile, as illustrated in FIG. 10, the spacer 250 may be irregularly disposed in the non-light-emitting area NEA, but the present disclosure is not limited thereto and therefore the spacer 250 may be regularly disposed.

For example, assuming that a first to fourth subpixels SP1 to SP4 are disposed in a straight line, a spacer 250 is not disposed in one side of the first subpixel SP1, a spacer 250 is disposed at least one side of the second subpixel SP2, a spacer 250 is not disposed in one side of the third subpixel SP3, and a spacer 250 is disposed at least one side of the fourth subpixel SP4.

Although the spacer 250 is disposed at least one side of the at least one subpixel SP in FIG. 10, the present disclosure is not limited thereto, and therefore the spacer may be located in a circuit area CA inside at least one subpixel SP.

Such a spacer 250 serves to secure the light emitting layer 370 located between other spacers arranged in the vicinity so that the light emitting layer 370 is not delaminated.

For example, a spacer 250 in a light emitting layer 370 located between a spacer 250 located in one side of the second subpixel SP2 and a spacer 250 located in one side of the third subpixel SP3 has the second tapering shape, and thus the light emitting layer 370 is prevented from being delaminated.

Figure 11:
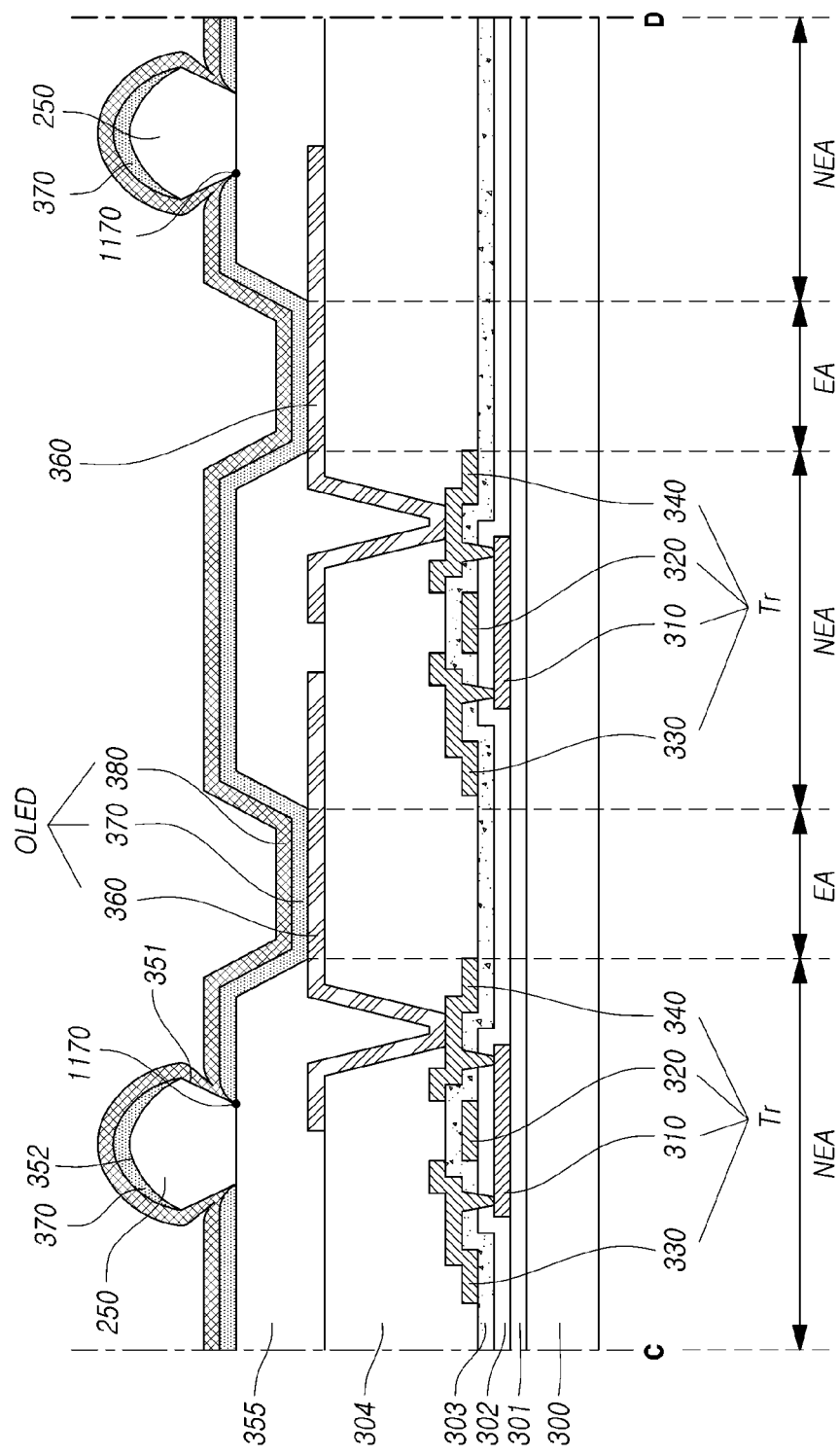
FIG. 11 is a cross-sectional view taken along with line C-D of FIG. 10.

Referring to FIG. 11, further discussion is given below.

FIG. 11 is a sectional view taken along with C-D of FIG. 10. In the following description, the same or equivalent features, structures, characteristics, components, contents, or configurations as the above-described aspects will not be described repeatedly.

Referring to FIG. 11, a spacer 250 is disposed on a bank 355 in a non-light-emitting area NEA. In addition, a light emitting layer 370 is disposed between other spacers 250 disposed in vicinity of one spacer 250 and in a part of a surface of each spacer 250.

The light emitting layer 370 may not be formed in an area corresponding to a part of a side surface of the spacer 250.

Meanwhile, it has been described above that, when an external force is applied to the light emitting layer (370) disposed on a first electrode 360 and a bank 355 in a state of weak adhesion with them, delamination may occur.

However, since an end portion 1170 of the light emitting layer 370 overlap a first outer portion 351 of the spacer 250, even if the end portion 1170 is separated from the bank 355, the end portion 1170 is caught by the first outer portion 351 and therefore the light emitting layer 370 can be prevented from being completely delaminated.

In addition, as illustrated in FIG. 11, at least two end portions 1170 of the light emitting layer 370 may be disposed to overlap the first outer portion 351 of the spacer 250, and this means that, as illustrated in FIG. 10, on a plane, the spacer 250 overlaps the at least two end portions 1170 in at least two side surfaces of the light emitting layer 370.

Thus, since the spacer 250 serves to push the end portions 1170 of the light emitting layer 370 in at least two side surfaces of the light emitting layer 370, the light emitting layer 370 can be prevented from being delaminated.

Figure 12:
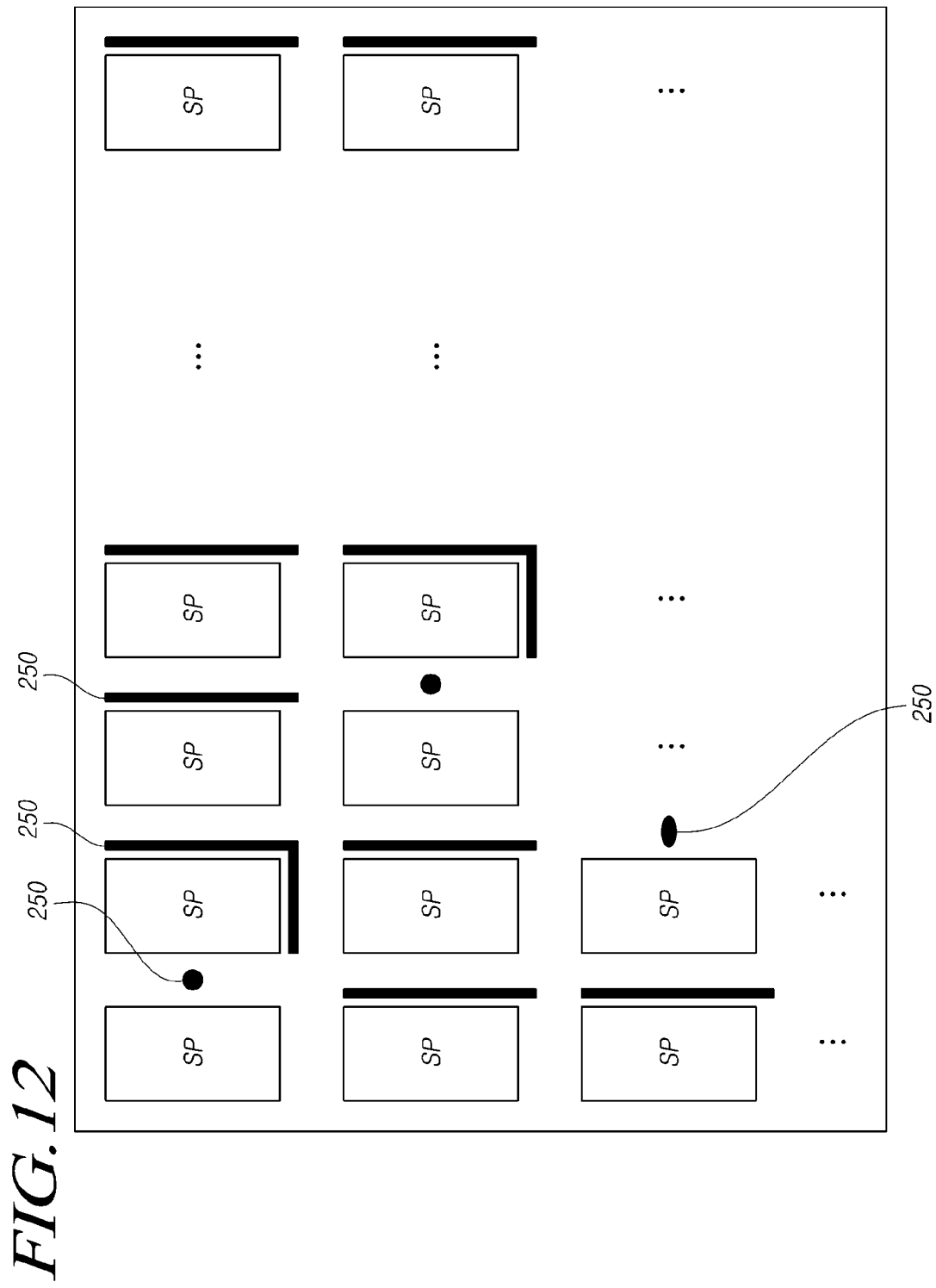
FIG. 12 is a view schematically illustrating arranged configurations of a plurality of subpixels and one or more spacers in a display panel of a display device according to another aspect of the present disclosure.

Meanwhile, although, in FIGS. 10 and 11, illustrated are configurations in which the number of subpixels SP provided in the display panel 110 is equal to the number of the spacers 250, and a plurality of spacers 250 have the same size and shape on a plane, the present disclosure is not limited thereto and a configuration or shape as illustrated in FIG. 12 may be used.

FIG. 12 is a view schematically illustrating arranged configurations of a plurality of subpixels and one or more spacers in a display panel of a display device according to another aspect of the present disclosure. In the following description, the same or equivalent features, structures, characteristics, components, contents, or configurations as the above-described aspects will not be described repeatedly.

Referring to FIG. 12, a display panel 110 includes a plurality of subpixels SP and a plurality of spacers 250. In this case, the number of the subpixels SP may be the same as the number of the spacers 250. However, the present disclosure is not limited thereto, and both an area in which the number of spacers 250 is the same as the number of subpixels SP and an area in which the number of spacers 250 is different from the number of subpixels SP may be present.

In addition, as illustrated in FIG. 12, a plurality of spacers 250 may include at least one spacer 250 having a different size from other spacers 250. In addition, a plurality of spacers 250 may include at least one spacer 250 having a shape different from other spacers.

In this case, the spacer 250 may have at least one shape of circular, elliptical, polygonal, linear and curved line shapes on a plane.

As a result, in a case where the sizes or shapes of non-light-emitting areas in which a plurality of spacers 250 are located are different from each other, the size or shape of the spacer 250 may be changed, and therefore the spacer 250 may be located only in the non-light-emitting area without invading a light emitting area.

Meanwhile, the display device 100 according to the present disclosure may be a bendable display device 100 in which at least one bending area is provided, and at least one spacer 250 may be located in the bending area.

Such a configuration is discussed below with reference to FIGS. 13 and 14.

Figure 13:
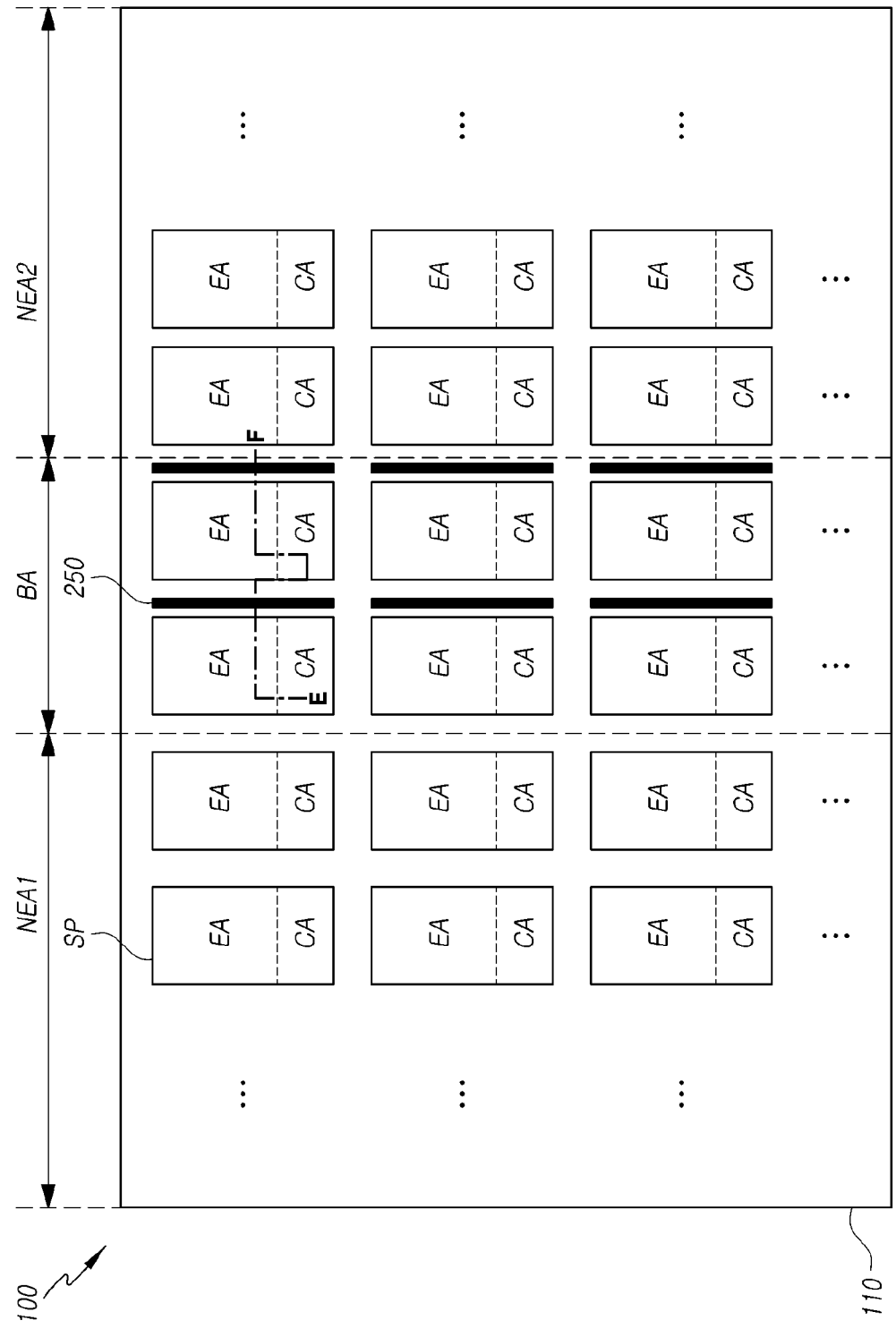
FIG. 13 is a view schematically illustrating arranged configurations of a plurality of subpixels and one or more spacers in a display panel of a bendable display device according to another aspect of the present disclosure.

FIG. 13 is a view schematically illustrating arranged configurations of a plurality of subpixels and one or more spacers in a display panel of a bendable display device according to another aspect of the present disclosure. FIG. 14 is a sectional view taken along with line E-F of FIG. 13. In the following description, the same or equivalent features, structures, characteristics, components, contents, or configurations as the above-described aspects will not be described repeatedly.

Figure 14:
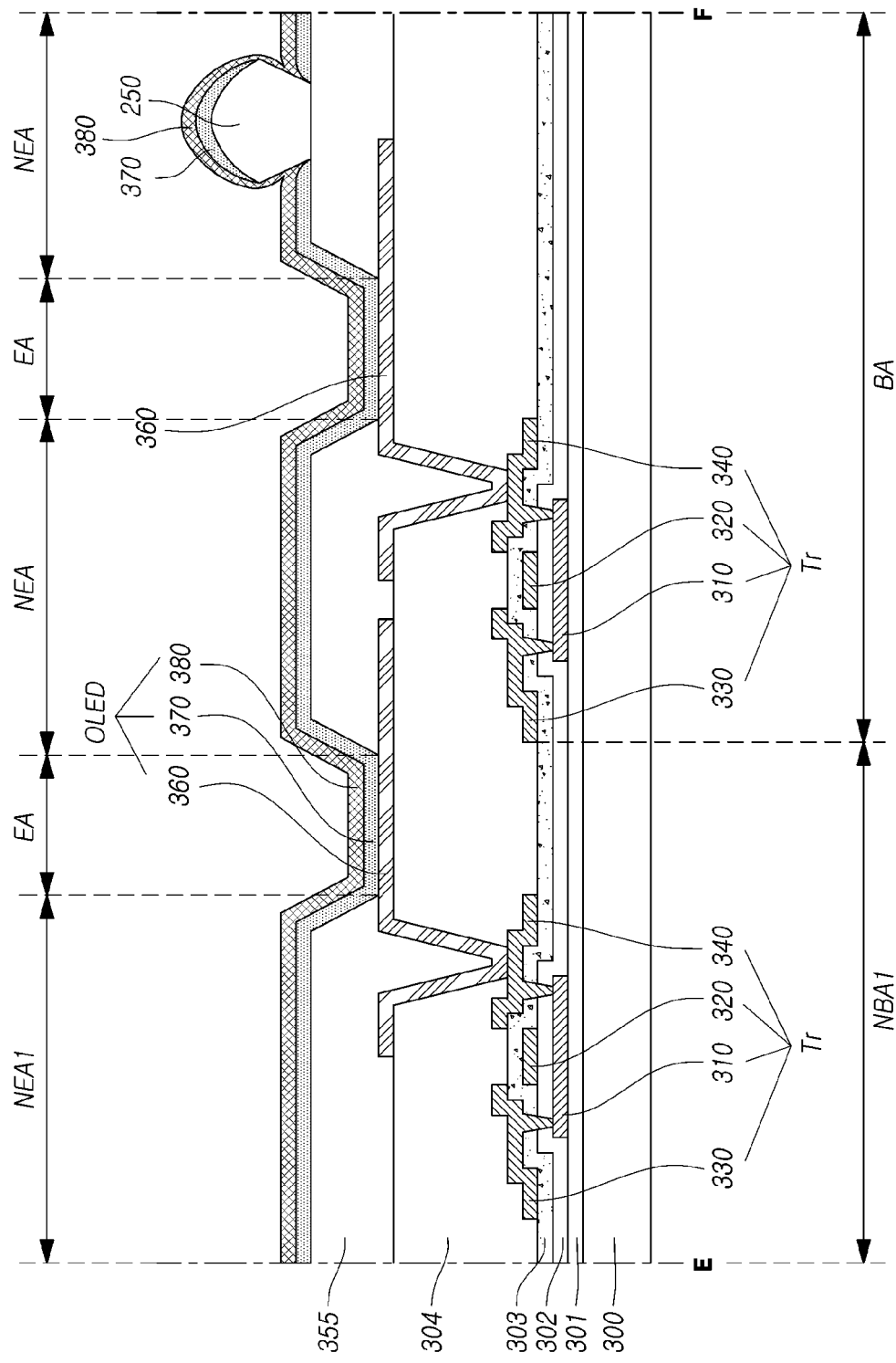
FIG. 14 is a cross-sectional view taken along with line E-F of FIG. 13.

Referring to FIGS. 13 and 14, a display device 100 according to another aspect of the present disclosure may be a display device 100 including at least one bending area BA and at least two non-bending areas NBA1 and NBA2.

The display device 100 according to aspects of the present disclosure may be a display device 100 capable of stably being operated in a state where the display device is bended by an external force.

Although the display device 100 according to aspects of the present disclosure is illustrated as a bendable display device 100 in FIG. 13, this illustration is just one example, and therefore a display device 100 according to aspects of the present disclosure may be a display device 100 such as a foldable display device, a curved display device, a rollable display device, a flexible display device, or the like.

In addition, bending a display device 100 according to aspects of the present disclosure may include all of the meaning of bending or folding the display device 100.

Although not shown separately, a display device 100 according to aspects of the present disclosure may be used in a wide range of applications including, but not limited to, large electronic devices such as televisions or external billboards, small-sized electronic devices, such as mobile phones, personal computers, notebook computers, personal digital assistants, automobile navigation units, wristwatch-type electronic devices, cameras, or the like.

Meanwhile, a spacer 250 in a display panel 110 of the display device 100 according to aspects of the present disclosure may be provided in a bending area BA.

In FIG. 13, although the spacer 250 is disposed in at least one side of one subpixel SP, but the present disclosure is not limited thereto. In a case where the spacer 250 is disposed in one side of one subpixel SP, the number of spacers 250 may be the same as the number of subpixels SP. However, aspects of the present disclosure include a case in which the number of the spacers 250 provided in the display panel 110 is smaller than the number of subpixels SP.

Meanwhile, it has been described above that the pacer 250 has a function of preventing the light emitting layer 270 from being delaminated from by an external force In particular, when the display device 100 is bent, an external force may be heavily applied to the bending area BA, and, as a result, large stresses may occur in a light emitting layer 370 located in the bending area BA. Accordingly, the light emitting layer 370 located in the bending area BA may be delaminated from a bank 355, a first electrode 360, or the like by stresses occurred in the light emitting layer 370.

However, since at least one spacer 250 is located in a non-light-emitting area NEA of a bending area BA to which an external force is heavily applied, and serves to secure the light emitting layer 370 so that the light emitting layer 370 is not delaminated, therefore, produced is an effect of improving the characteristics of the organic light emitting device OLED.

Meanwhile, a bendable organic light emitting display device may include a first spacer required to support a mask used in a process of growing a light emitting layer. In addition, the display device may include a second spacer capable of securing the light emitting layer so that the light emitting layer is not delaminated when a display device is bent, folded or flexed by an external force.

However, since the first spacer supporting the mask is rubbed by the mask during a process, as a result, foreign substances may generate. In particular, in a case where the first and second spacers have the same height, they may be rubbed by the mask during a process for growing the light emitting layer. Accordingly, it is required that the first spacer has a greater height than the second spacer to prevent the second spacer from being rubbed by the mask during a process.

In this case, since the thickness of the display device increases as the height of the first spacer increases, it is not easy to slim the display device 100.

However, since the spacer 250 according to the present disclosure supports the mask in point contact with a mask used when the light emitting layer 370 is formed and, at the same time, serves to secure the light emitting layer 370, therefore, different spacers from each other are not necessary. Accordingly, to minimize a rubbing phenomenon, it is not necessary to provide a height difference between different spacers from each other, and, as a result, it is easy to slim the display device 100.

Meanwhile, although in FIGS. 2a, 2b, 2c, 10, 12 and 13 it has been described that a plurality of subpixels SP is arranged in a matrix type, arrangement types of a plurality of subpixels SP in the display device according to aspects of the present disclosure are not limited thereto.

Figure 15:
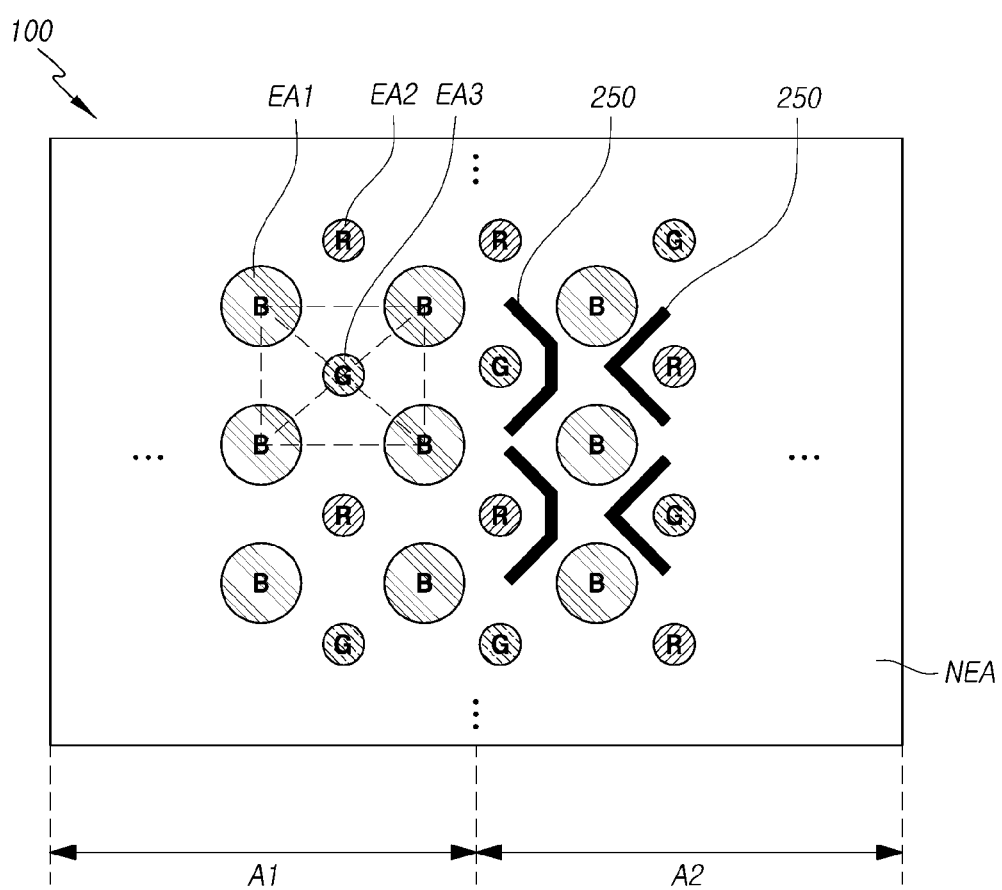
FIG. 15 is a plan view illustrating arranged configurations of subpixels and the location of one or more spacers in a display device according to another aspect of the present disclosure.
Figure 16:
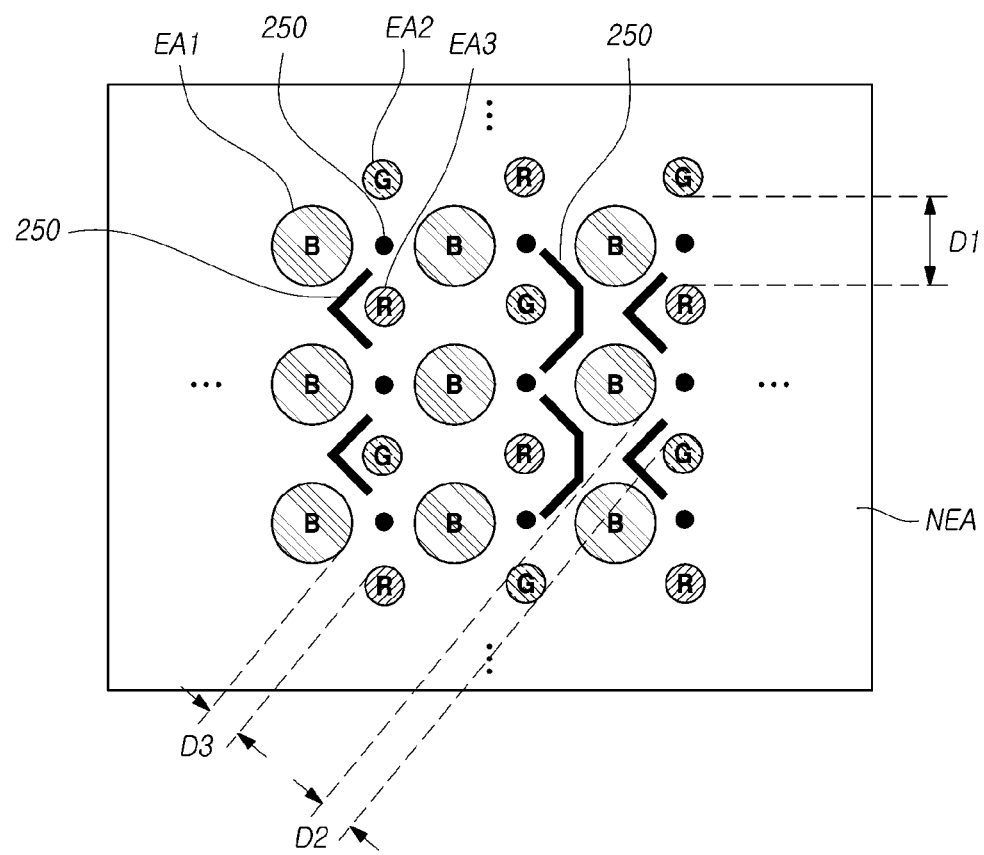
FIG. 16 is a plan view illustrating arranged configurations of subpixels and various shapes and sizes of one or more spacers in a display device according to another aspect of the present disclosure.

As an exemplary aspect, as illustrated in FIGS. 15 and 16, a plurality of subpixels SP may be disposed in a zigzag, and one or more spacers 250 between the light emitting areas EA of the subpixels SP may be located. Such a configuration is discussed below with reference to FIGS. 15 and 16.

FIG. 15 is a plan view illustrating arranged configurations of subpixels and the location of one or more spacers in a display device according to another aspect of the present disclosure. FIG. 16 is a plan view illustrating arranged configurations of subpixels and various shapes and sizes of one or more spacers in a display device according to another aspect of the present disclosure. In the following description, the same or equivalent features, structures, characteristics, components, contents, or configurations as the above-described aspects will not be described repeatedly.

Referring to FIGS. 15 and 16, a display device 100 according to aspects of the present disclosure includes a plurality of a first light emitting areas EA1 emitting a first color, a plurality of a second light emitting areas EA2 emitting a second color and a plurality of a third light emitting areas EA3 emitting a third color.

In this case, the first light emitting area EA1 is disposed in a matrix type, and, in a center point of an area composed of four first light emitting areas, light emitting areas EA2 and EA3 having a smaller area than the first light emitting area EA1 and emitting colors different from the first light emitting area EA1 may be disposed.

For example, the second light emitting area EA2 or the third light emitting area EA3 may be disposed in the center point of the area composed of the four first light emitting areas EA1.

In this case, the first, second and third light emitting areas EA1, EA2 and EA3 may emit blue, red, and green lights B, R and G respectively, but the present disclosure is not limited thereto, and therefore the emitting colors of the respective light emitting areas EA1, EA2 and EA3 may be changed.

Accordingly, since the light emitting areas EA1, EA2 and EA3 emitting different colors from one another have different areas, the luminance lifetime of the first light emitting area EA1 becomes uniform with the luminance lifetime of the second and third light emitting areas EA2 and EA3, and a color change of the display device 100 can be minimized.

For example, if the lifetime of an organic light emitting device OLED emitting the first color is shorter than that of organic light emitting devices OLED emitting the second and third colors, an area of a first light emitting area EA1 in which the organic light emitting device OLED emitting the first color is located may be made larger than areas of the second and third light emitting areas EA2 and EA3.

In addition, according to the lifetime of the organic light emitting devices OLED emitting the second and third colors, the size or shape of areas of the second and third light emitting areas EA2 and EA3 may be changed.

Meanwhile, although FIGS. 15 and 16 illustrate that the first to third light emitting areas EA1 to EA3 have a circular shape in plan shape, the present disclosure is not limited thereto, and therefore the first to third light emitting areas EA1 to EA3 may be, in plan shape, a circular shape, an elliptical shape, a polygonal shape, or the like.

In addition, according to aspects of the present disclosure, as illustrated in FIG. 15, a spacer 250 may not be disposed in a first portion A1 of an organic light emitting display device 100 and may be disposed in a second portion A2 thereof.

That is, a spacer 250 may be disposed in only a part of a non-light-emitting area NEA of the display device 100, and in particular, a spacer 250 may be disposed in only a part of a non-light-emitting area NEA of the second portion A2.

In this case, the first portion A1 may mean only an area in which a space is not disposed in a non-light-emitting area NEA, or mean an area which includes both an area in which a space is not disposed and an area in the vicinity.

On the contrary, the second portion A2 may mean only an area in which a space is disposed in a non-light-emitting area NEA, or mean an area which includes both an area in which a space is disposed and an area in the vicinity.

In addition, as illustrated in FIG. 16, the spacer 250 may have various shapes and sizes. The spacer 250 may have at least one shape of a circular, elliptical, polygonal, linear and curved line shapes on a plane.

As described above, the first light emitting area EA1 is disposed in a matrix type, and, in a center point of an area composed of four first light emitting areas, light emitting areas EA2 and EA3 having a smaller area than the first light emitting area EA1 and having different colors from the first light emitting area EA1 may be disposed. Therefore, the sizes of areas between light emitting areas EA1, EA2 and EA3 disposed in the vicinity may be different.

Specifically, the sizes of the non-light-emitting areas NEA between the light emitting areas EA1, EA2 and EA3 disposed in the vicinity may be different.

Accordingly, depending on which of the light emitting areas a spacer 250 is located between, the size of an area in which the spacer is disposed varies.

For example, comparing sizes on a plane of light emitting areas, at least one of a first size D1 of a non-light-emitting area NEA between the second light emitting area EA2 and the third light emitting area EA3, a second size D2 of a non-light-emitting area NEA between the first light emitting area EA1 and the second light emitting area EA2 and a third size D3 of a non-light-emitting area NEA between the first light emitting area EA1 and the third light emitting area EA3 may be different from that of other areas, or the first, or all of the first, second and third sizes D1, D2 and D3 may be different from one another.

As a result, the size of a non-light-emitting area NEA corresponding to a spacer 250 disposed between the light emitting areas EA1, EA2 and EA3 different from one another varies, depending on which of the light emitting areas EA1, EA2 and EA3 the spacer 250 is located between. For example, when the third size D3 is the smallest, a spacer 250 located between the first light emitting area EA1 and the third light emitting area EA3 may have the smallest shape or size, or have a smaller size.

Since having various shapes and sizes, the spacer can be disposed only in a non-light-emitting area NEA between the light emitting areas EA1, EA2 and EA3 different from one another without invading the light emitting areas EA1, EA2 and EA3.

In this case, at least one spacer 250 may be located between the second light emitting area EA2 and the third light emitting area EA3 having a first size D1, between the first light emitting area EA1 and the second light emitting area EA2 having a second size D2, or between the first light emitting area EA1 and the third light emitting area EA3 having a third size D3.

Because of this, the spacer 250 may support a mask between light emitting areas, when a light emitting layer 370 is formed, Meanwhile, although, in above description, the spacer 250 has been applied to an organic light emitting display device, the present disclosure is not limited thereto, and therefore such a space may be applied to various display devices.

Figure 17:
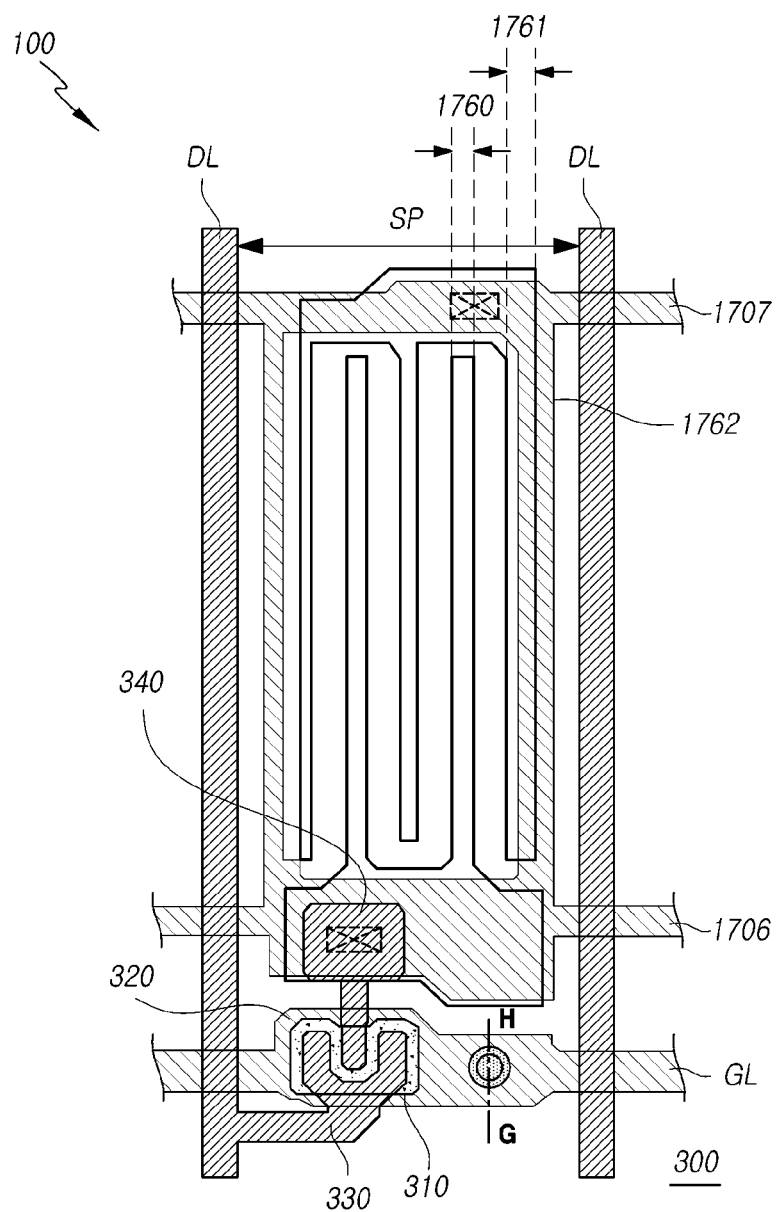
FIG. 17 a plan view illustrating a location of a spacer in a display device according to another aspect of the present disclosure.
Figure 18:
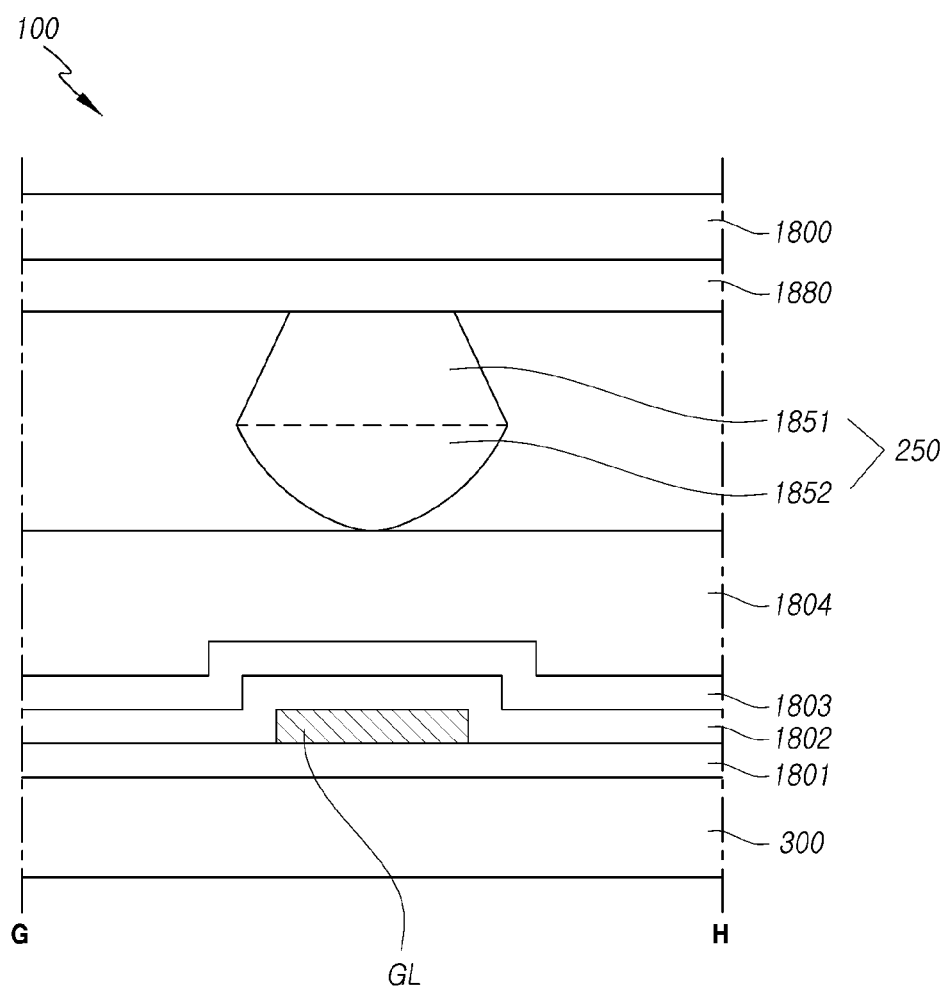
FIGS. 18 and 19 are cross-sectional views taken along with line G-H of FIG. 17.
Figure 19:
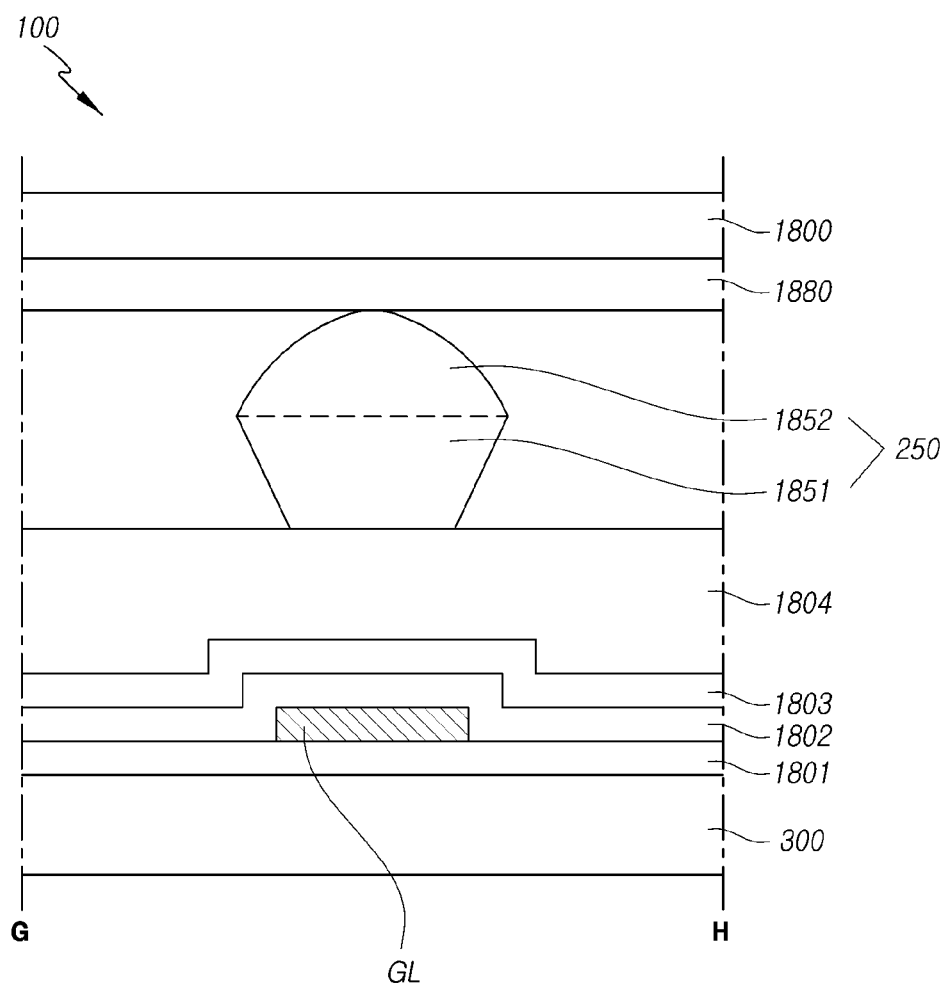

Referring to FIGS. 17 to 19, according to aspects of the present disclosure, a spacer applied to a liquid crystal display device is described.

FIG. 17 a plan view illustrating the location of a spacer in a display device according to another aspect of the present disclosure. In the following description, the same or equivalent features, structures, characteristics, components, contents, or configurations as the above-described aspects will not be described repeatedly.

Referring to FIG. 17, a gate line GL extending in one direction on a substrate 300 and first and second common lines 1706 and 1707 arranged in parallel are disposed. A data line DL is disposed in a direction intersecting the gate line GL and the common lines 1706 and 1707.

The gate line GL and the data line DL may define a subpixel SP by intersecting each other.

In the area of the subpixel SP located a thin film transistor Tr including a gate electrode 320 which is a part of the gate line GL, an active layer 310 located beneath the gate electrode 320, and a source electrode 330 and a drain electrode 340 located on the gate electrode 320 and spaced apart from each other.

In both sides of the subpixel SP disposed a first common electrode 1762 formed in the same layer and made of the same material, as the first and second common lines 1706 and 1707, and connected to the first and second common lines 1706 and 1707, and in the center area of the subpixel SP disposed a second common electrode 1761 contacting the second common line 1707 and having a bar shape extending vertically.

A pixel electrode 1760 is disposed between the second common electrodes 1761, and the pixel electrode 1760 may contact the drain electrode 340. The second common electrode 1761 and the pixel electrode 1760 may be a transparent electrode.

The structure of the display device 100 as described above is just one example, and a characteristic configuration is that, on a substrate 300 or an upper substrate bonding with the substrate 300, a spacer is located to maintain a gap between the two substrates.

Such a spacer 250 causes the two substrates to be disposed in parallel to each other without being bent and causes liquid crystals to be arranged in a rubbing direction, and, as a result, the display device 100 can realize a clear black.

Specifically, if two substrates are not parallel to each other, liquid crystals adjacent to a surface of the substrate are arranged parallel to a bending direction and therefore arranged differently from an initial state as a whole. In this case, since the arrangement of such liquid crystals does not maintain an initial black state, the light passing through a liquid crystal layer rotates while experiencing a retardation different from light passing through a normal area, and as a result, a light leakage phenomenon occurs.

Such a spacer 250 may be located in an area other than an area in which an image is displayed. For example, a spacer 250 may not be disposed in an area in which the second common electrode 1761 and the pixel electrode 1760 are located.

Meanwhile, although the spacer 250 overlaps the gate line GL in FIG. 17, the present disclosure is not limited thereto. For example, the spacer 250 may be disposed to overlap at least one area or configuration of an area in which a thin film transistor Tr is located and the first and second common lines 1706 and 1707.

An arrangement relationship between a spacer 250 disposed on the gate line GL and other configurations is discussed below.

FIGS. 18 and 19 are sectional views taken along with G-H of FIG. 17.

Referring to FIG. 18, a buffer layer 1801 is disposed on a first substrate 300 (a lower substrate). A gate line GL is disposed on the buffer layer 1801. A gate insulating layer 1802 is disposed on the gate line GL. An interlayer insulating layer 103 is disposed on the gate insulating layer 1802. A planarization layer 1084 may be disposed on the interlayer insulating layer 103.

Meanwhile, although a plurality of inorganic films and organic films are arranged on the gate line GL in FIG. 18, these names are not limited to the above-mentioned names, and the number is also not limited to the figure.

A second substrate 1800 (upper substrate) is disposed to face the first substrate 300 A color filter 1880 is disposed on a surface of the second substrate 1800. A spacer 250 is disposed on the color filter 1880. However, a planarization layer between the color filter 1880 and the spacer 250 may be further disposed.

In this case, the spacer 250 includes a first part 1851 and a second part 1852. The width of the first part 1851 increases as the first part moves away from the second substrate 1800, and the width of the second part 1852 decreases as the second part moves away from the second substrate 1800. An outer edge of the first part 1851 has a second tapering shape, and an outer edge of the second part 1852 includes a part having a first tapering shape or a part having a convex shape.

Such a spacer 250 is disposed between the first substrate 300 and the second substrate 1800, and enables a gap between the first substrate 300 and the second substrate 1800 to be maintained. To do this, one surface of the spacer 250 may contact a planarization layer 1804 located on the first substrate 300, and the other surface may contact the color filter 1880 located on the second substrate 1800.

Although, in FIG. 18, the width of the first or second part 1851, 1852 of the spacer 250 increases and decreases respectively as moving away from the second substrate 1800, the present disclosure is not limited thereto.

As illustrated in FIG. 19, the width of the first part 1851 of the space 250 may increase as the first part moves away from the first substrate 300, and the width of the second part 1852 may decrease as the second part moves away from the first substrate 300.

Since the display device 100 according to aspects of the present disclosure is provided with the spacer 250 having the shape described above, a gap between the first and second substrates 300 and 1800 is provided and therefore enables two substrates 300 and 800 to be maintained in an arrangement state in parallel to each other. Accordingly, liquid crystals can be arranged in a rubbing direction, and thus the display device 100 can realize a clear black.

According to the various aspects of the present disclosure as described above, provided is a display device having a structure in which an upper substrate and a lower substrate are disposed in spaced, parallel relation to each other when the display device includes the upper and lower substrates.

According to the various aspects of the present disclosure, provided is a display device having a structure preventing, from being generated, foreign substances caused by the spacer included in a display device which can be bent, and, at the same time, capable of increasing the quality of displayed images by preventing a light emitting layer from being delaminated.

According to the various aspects of the present disclosure, provided is a display device having a structure capable of sliming a display device which can be bent.

The features, structures, configurations, and effects described in the present disclosure are included in at least one aspect but are not necessarily limited to a particular aspect. A person skilled in the art can apply the features, structures, configurations, and effects illustrated in the particular aspects to another one or more additional aspect by combining or modifying such features, structures, configurations, and effects. It should be understood that all such combinations and modifications are included within the scope of the present disclosure. Although the exemplary aspects have been described for illustrative purposes, a person skilled in the art will appreciate that various modifications and applications are possible without departing from the essential characteristics of the present disclosure. For example, the specific components of the exemplary aspects may be variously modified. The various aspects described above can be combined to provide further aspects. These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. An organic light emitting display device comprising:
   a first electrode disposed on a substrate;
   a bank disposed in such a way that a part of an upper surface of the first electrode exposes;
   at least one spacer disposed on the bank;
   a light emitting layer disposed on the exposed part of the first electrode; and
   a second electrode disposed on the light emitting layer,
   wherein the at least one spacer includes a first outer edge portion corresponding to a first height between a top of the bank and above the bank, and a second outer edge portion corresponding to a predetermined height from the first height,
   wherein the first outer edge portion has a second tapering shape, and the second outer edge portion includes a part having a first tapering shape or a part having a convex shape,
   wherein the substrate is bendable at a bending area, and the at least one spacer is located at the bending area.

2. The organic light emitting display device according to claim 1, wherein the light emitting layer is disposed on the second outer edge portion of the at least one spacer.

3. The organic light emitting display device according to claim 1, wherein at least a part of the first outer edge portion is not covered by the light emitting layer.

4. The organic light emitting display device according to claim 3, wherein the non-covered first outer edge portion directly contacts the second electrode.

5. The organic light emitting display device according to claim 1, wherein the second electrode is disposed on the first and second outer edge portions.

6. The organic light emitting display device according to claim 1, wherein the bank separates a light emitting area and a non-light-emitting area from each other, and the at least one spacer is located in the non-light-emitting area.

7. The organic light emitting display device according to claim 1, wherein the at least one spacer is disposed on the bank and includes at least one spacer different from others in size.

8. The organic light emitting display device according to claim 1, wherein the at least one spacer is disposed on the bank and includes at least one spacer different from others in shape.

9. The organic light emitting display device according to claim 1, wherein the at least one spacer is disposed on the bank and has one of circular, elliptical, polygonal, linear and curved line shapes in cross-section.

10. The organic light emitting display device according to claim 1, further comprising a plurality of first light emitting areas emitting a first color and disposed in a matrix form and including four central emission areas.

11. The organic light emitting display device according to claim 10, wherein the four central emission areas are smaller than each of the plurality of first light emitting areas and emitting a color different from the plurality of first light emitting areas.

12. The organic light emitting display device according to claim 10, wherein at least one spacer is disposed between at least one of the plurality of first light emitting areas and the four central emission areas emitting the different color.

13. A display device comprising:
    a first electrode disposed on a substrate;
    a bank located in a non-display area and disposed in such a way that a part of an upper surface of the first electrode exposes;
    at least one protruding member disposed on the bank;
    a light emitting layer disposed on the exposed part of the first electrode; and
    a second electrode disposed on the light emitting layer,
    wherein the at least one protruding member includes at least one inflection portion at which an outer circumference of the at least one protruding member is increased and decreased as the at least one protruding member extends away from the bank,
    wherein the substrate is bendable at a bending area, and the at least one protruding member is located at the bending area.

14. A display device comprising:
    a first substrate and a second substrate; and
    at least one spacer disposed on one of the first substrate and the second substrate,
    wherein the at least one spacer includes a first part and a second part disposed on the first part,
    wherein a width of the first part increases as the first part moves away from the one substrate, and a width of the second part decreases as the second part moves away from the one substrate,
    wherein the substrate is bendable at a bending area, and the at least one spacer is located at the bending area.

15. The display device according to claim 14, wherein the first part has a second tapering shape, and the second part includes a part having a first tapering shape or a part having a convex shape.

16. The display device according to claim 14, further comprising a light emitting layer disposed on the second part.

17. The organic light emitting display device according to claim 14, wherein the at least one spacer includes at least one spacer different from others in size.

18. The organic light emitting display device according to claim 14, wherein the at least one spacer includes at least one spacer different from others in shape.

19. The organic light emitting display device according to claim 14, wherein the at least one spacer has one of circular, elliptical, polygonal, linear and curved line shapes in cross-section.

20. The organic light emitting display device according to claim 14, further comprising a plurality of first light emitting areas emitting a first color and disposed in a matrix form and including four central emission areas.

21. The organic light emitting display device according to claim 20, wherein the four central emission areas are smaller than each of the plurality of first light emitting areas and emitting a color different from the plurality of first light emitting areas.

22. The organic light emitting display device according to claim 21, wherein at least one spacer is disposed between at least one of the plurality of first light emitting areas and the four central emission areas emitting the different color.

\* \* \* \* \*